(12) United States Patent
Takiguchi et al.

(10) Patent No.: US 6,228,465 B1
(45) Date of Patent: May 8, 2001

(54) PROCESS FOR PRODUCING MULTILAYER WIRING BOARDS

(75) Inventors: Yoshikazu Takiguchi, Port Washington, NY (US); Hiroyuki Obiya, Kanagawa-ken (JP); Toru Takahashi, Kanagawa-ken (JP); Taisuke Shiroyama, Kanagawa-ken (JP); Kenji Tazawa, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/273,265

(22) Filed: Mar. 22, 1999

Related U.S. Application Data

(62) Division of application No. 08/807,504, filed on Feb. 27, 1997, now Pat. No. 6,010,956.

(30) Foreign Application Priority Data

| Feb. 29, 1996 | (JP) | 8-69083 |
| Aug. 5, 1996 | (JP) | 8-220767 |
| Aug. 26, 1996 | (JP) | 8-242624 |
| Aug. 26, 1996 | (JP) | 8-242625 |
| Sep. 27, 1996 | (JP) | 8-277475 |

(51) Int. Cl.$^7$ ................................................. B32B 3/00
(52) U.S. Cl. ................. 428/209; 174/250; 174/258; 174/262; 430/18; 428/901
(58) Field of Search ..................... 428/209, 901; 174/250, 258, 262; 430/18

(56) References Cited

U.S. PATENT DOCUMENTS

| 3,681,474 | * | 8/1972 | Lombardi et al. | 29/195 |
| 4,347,306 | | 8/1982 | Takeda et al. | 427/96 |
| 5,485,038 | | 1/1996 | Licari et al. | 257/758 |
| 5,698,470 | | 12/1997 | Yamaguchi | 437/209 |
| 5,830,563 | * | 11/1998 | Shimoto et al. | 428/209 |
| 5,851,681 | * | 12/1998 | Matsuyama et al. | 428/209 |
| 5,993,945 | * | 11/1999 | Russell et al. | 428/209 |
| 5,997,997 | * | 12/1999 | Angelopoulos et al. | 428/209 |

FOREIGN PATENT DOCUMENTS 0 458 293   11/1991  (EP) .

* cited by examiner

*Primary Examiner*—Cathy Lam
(74) *Attorney, Agent, or Firm*—Wenderoth, Lind & Ponack, L.L.P.

(57) ABSTRACT

An improved process for producing a multilayer wiring board that has a plurality of conductor patterns and an interlevel dielectric layer on at least one surface of a substrate, with via holes or trench-like channels being provided at specified sites of said interlevel dielectric layer to establish an electrical interconnection between said conductor patterns, wherein prior to the provision of said via holes or trench-like channels, a coating having resistance to sandblasting is formed in a pattern over the interlevel dielectric layer and then sandblasting is performed to remove the interlevel dielectric layer in selected areas to form the via holes or trench-like channels and, thereafter, the coating having resistance to sandblasting is removed, followed by the provision of a conductive layer.

32 Claims, 6 Drawing Sheets

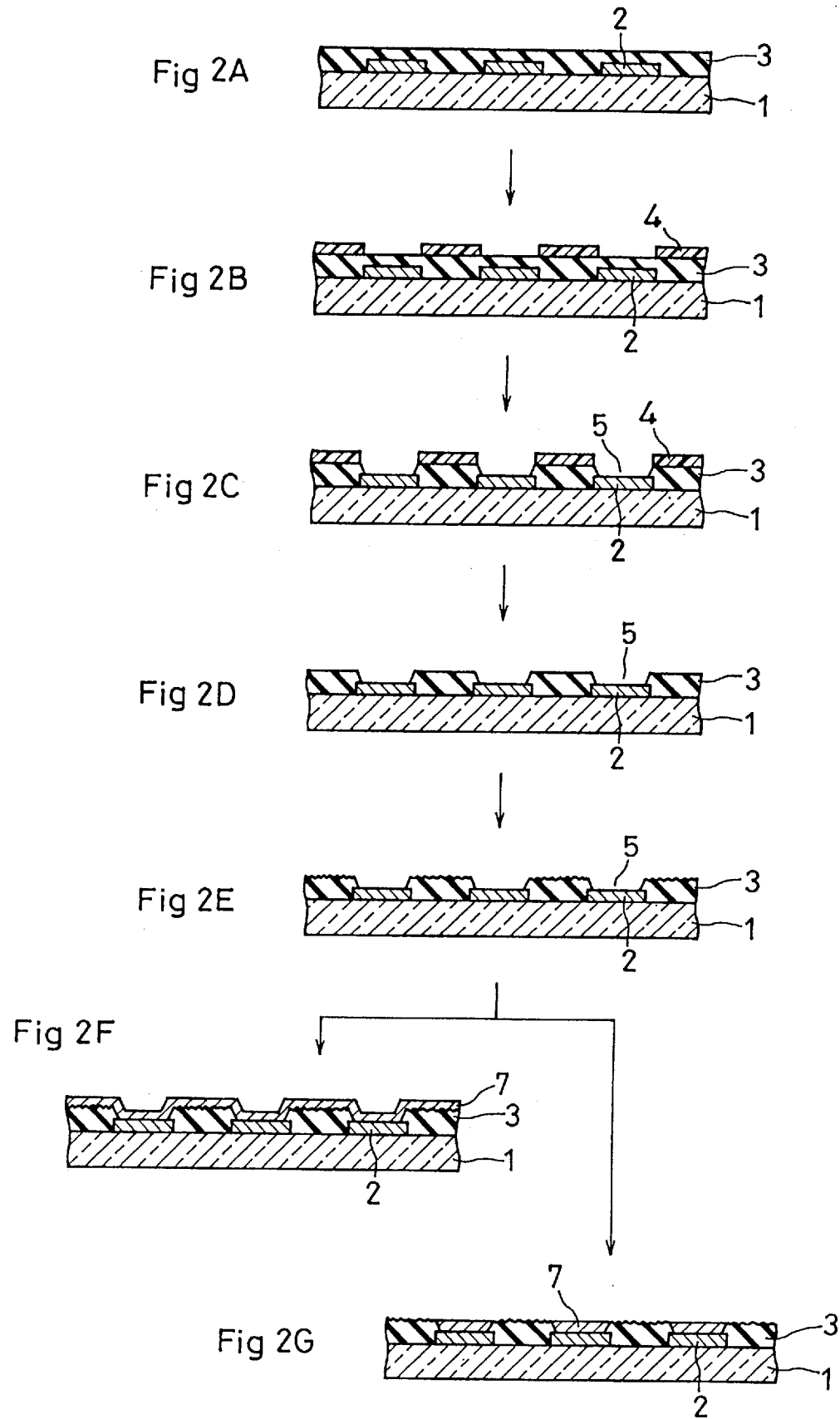

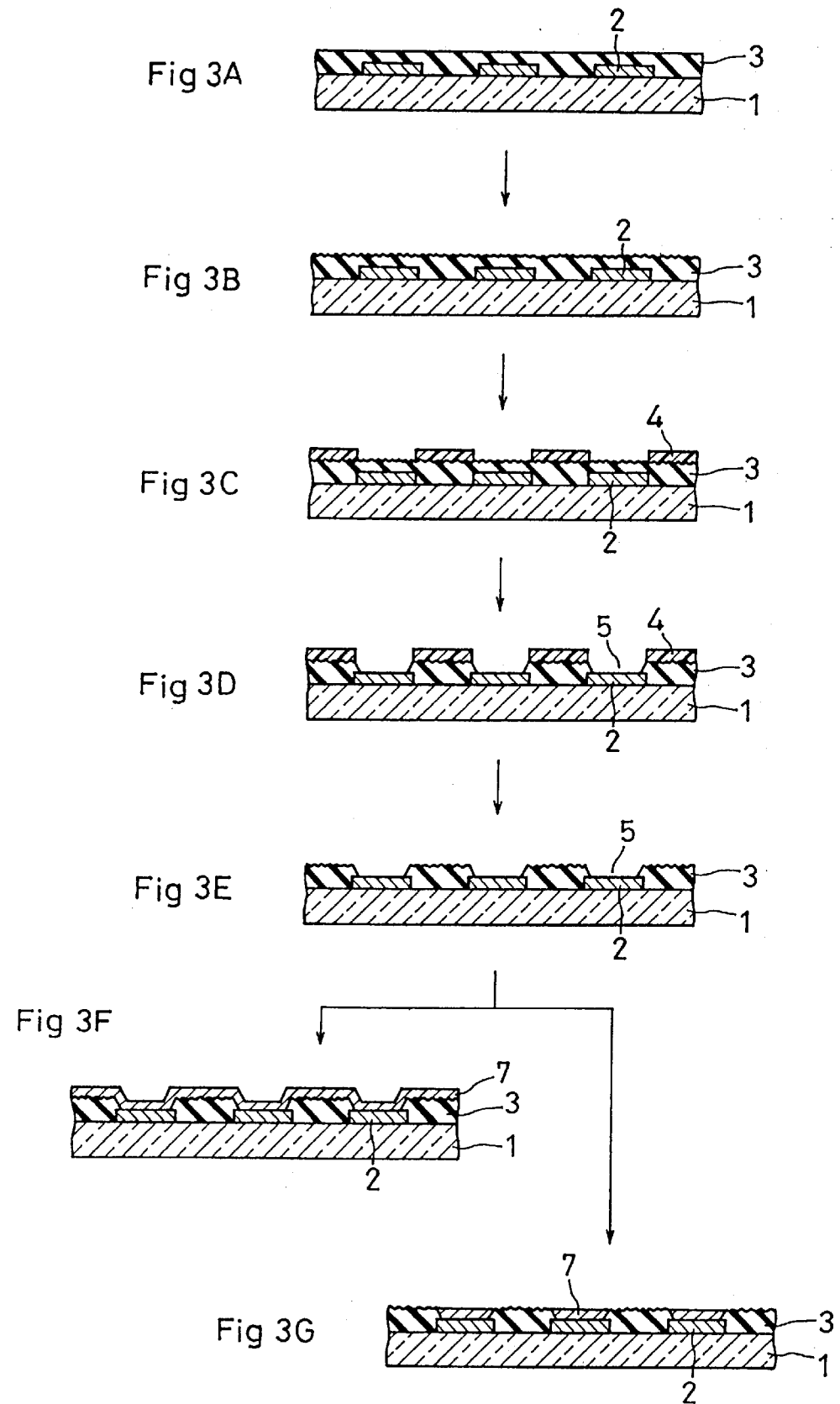

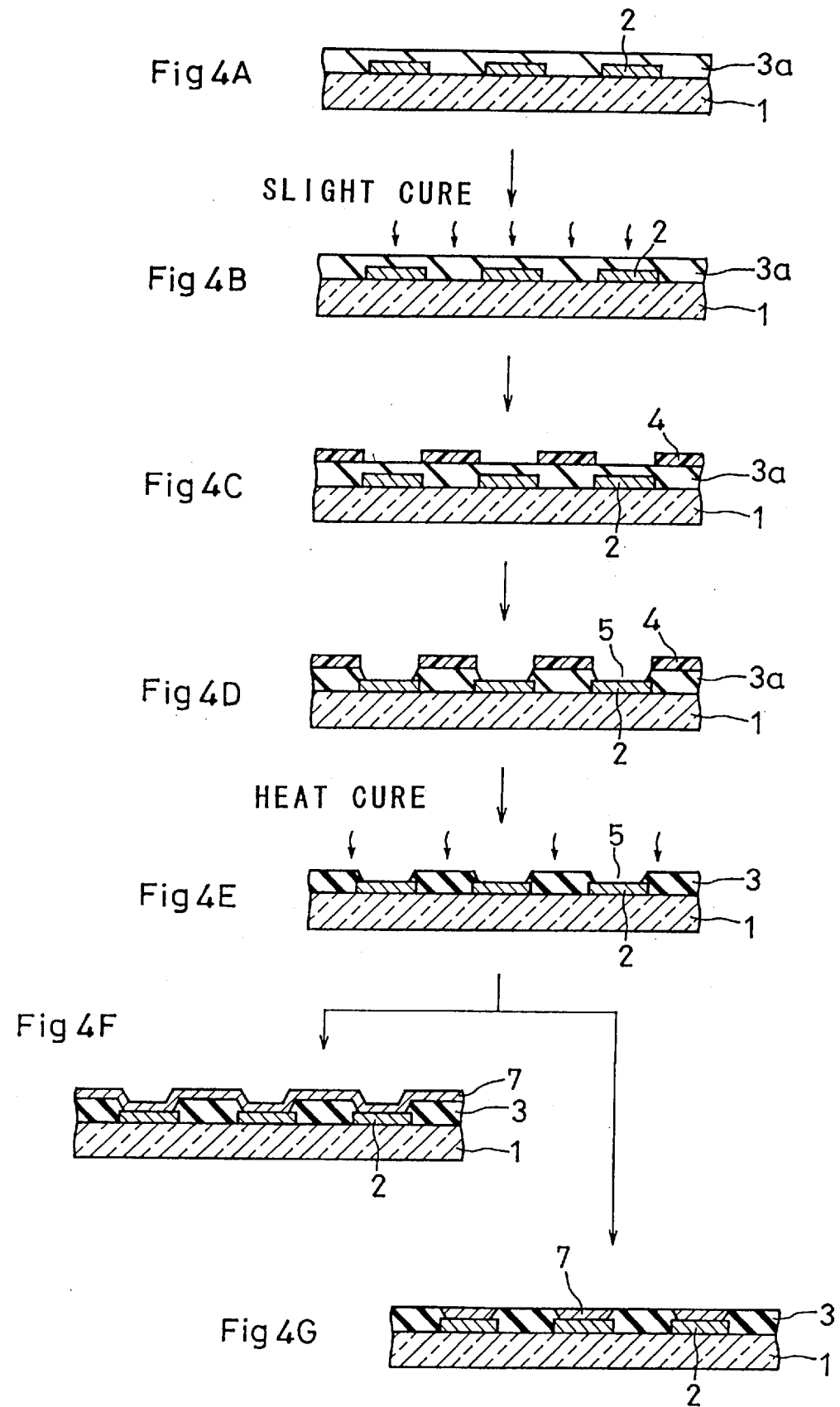

PRIOR ART

PROCESS FOR PRODUCING MULTILAYER WIRING BOARDS

The present application is a divisional application of Ser. No. 08/807,504, filed Feb. 27, 1997 now U.S. Pat. No. 6,010,956.

BACKGROUND OF THE INVENTION

1. Field of the Invention

This invention relates to a process for producing multilayer wiring boards. More specifically, the invention relates to a process for producing multilayer wiring boards of a "build-up" type having via holes or trench-like channels which have been formed by removing interlevel dielectric layers in selective areas to provide electrical interconnections of more than one level of conductor patterns.

2. Description of Relevant Art

With the recent advances electronic technology, efforts are being made to increase the degree of integration in electronic devices such as computers and to achieve faster calculating operations. Multilayer wiring boards are not an exception and those which permit high-density wiring or packaging are in demand; it is known that this requirement can be satisfied by multilayer wiring boards of the build-up type having via holes or trench-like channels for establishing an electrical connection between a first and a second level of conductor pattern.

Two typical examples of a an earlier technology multilayer wiring board fabricated by the build-up procedure are shown in FIGS. 6 and 7. A substrate 21 is overlaid with a first level of conductor pattern 22 which, in turn, is provided with a photosensitive resin layer (interlevel dielectric layer) 23 that is formed by screening or otherwise patterning an electrically insulating ceramic paste composition; the interlevel dielectric layer 23 is exposed by photolithography, developed and selectively etched away to form via holes 25; thereafter, electro- or non electroplating is performed to provide a conductive layer 26 within each via hole 25 or as a coextensive mass that fills each via hole 25 and the interlevel dielectric layer 23; subsequently, a second level of conductor pattern (not shown) is formed such that it is electrically connected to the underlying first level of conductor pattern 22.

The multilayer wiring boards fabricated by this earlier technology method have several problems. First, high-definition boards of sufficiently small feature sizes are not attainable if the interlevel dielectric layer is made of ceramic materials. Secondly, if the light-sensitive resin layer is employed, via holes will be formed that either have a rectangular cross section with vertical sidewalls (see FIG. 6) or tend to experience side etching by the liquid developer used in photolithography (see FIG. 7). In either case, the throwing power of the electro- or nonelectroplating technique employed to provide the conductor layer 26 within the via holes 25 or over the interlevel dielectric layer 23 is not satisfactory (no uniform plate is deposited) as shown in FIGS. 6 and 7 (see the encircled area A) and conduction failure will sometimes occur. This problem could be dealt with by sufficiently increasing the amount of electroless plate deposit to prevent short-circuiting but, on the other hand, the weight of the substrate will increase unavoidably, making it difficult to produce high-density, high-definition multilayer wiring boards.

With a view to forming a multilayer wiring board of high reliability using a smaller amount of electroless plate deposit, it has been proposed that resin particles soluble in an oxidizer be contained in a photosensitive resin layer slightly soluble in the oxidizer, with the resin particles being dissolved out by the action of the oxidizer, whereupon the interlevel dielectric layer is roughened to provide better adhesion to a conductive layer. This technology may be found in Unexamined Published Japanese Patent Application (kokai) No. 215623/1994. In this patent, strong acids such as chromic acid are used as the oxidizer in the roughening of the surface of the interlevel dielectric layer, but this is not preferred on account of the adverse effects that will be caused on the operating personnel and the substrate.

Recent environmental considerations require photosensitive resins that permit the use of dilute aqueous alkali solutions as the liquid developer and Unexamined Published Japanese Patent Application (kokai) No. 196856/1994 has proposed a photosensitive resin that is rendered developable with a dilute aqueous alkali solution by introducing carboxyl groups. However, the so modified light-sensitive resin is prone to suffer a decrease in insulation resistance and heat resistance, with occasional shorts. Hence, it has been difficult to realize multilayer wiring boards of high reliability by the proposed method. In addition, if an interlevel dielectric layer is made of this modified light-sensitive resin, it cannot withstand heating to temperatures higher than about 140° C. and it is also difficult to realize high peeling strength; therefore, if the interlevel dielectric layer made of this light-sensitive resin is used in modern versions of high-density wiring boards, problems such as flaking and chipping often occur due to damage of the interlevel dielectric layer.

Another approach that has been proposed is to make an interlevel di-electric layer of a thermosettable heat-resistant epoxy resin blended with an inorganic filler and then form via holes by means of a high-power laser such as a $CO_2$ gas laser or an excimer laser. However, in addition to the high equipment cost, the via holes formed have a rectangular cross section and conduction failure may occasionally occur even if a conductor layer is provided within each via hole; as a further problem, the sidewalls of the via holes are so smooth that the required adhesion to the applied conducive layer is not achieved.

SUMMARY OF THE INVENTION

The object of the invention is to provide a multilayer wiring board at low-cost that features good adhesion between an interlevel dielectric layer and a conductive layer, that has high heat resistance, that presents no environmental hazard and which yet has high reliability.

Thus, according to the invention, there is provided a process for producing a multilayer wiring board that has a plurality of conductor patterns and an interlevel dielectric layer on at least one surface of a substrate, with via holes or trench-like channels being provided at specified sites of said interlevel dielectric layer to establish an electrical interconnection between said conductor patterns, wherein prior to the provision of said via holes or trench-like channels, a coating having resistance to sandblasting is formed in a pattern over the interlevel dielectric layer and then sandblasting is performed to remove the interlevel dielectric layer in selected areas to form the via holes or trench-like channels and, thereafter, the coating having resistance to sandblasting is removed, followed by the provision of a conductive layer.

BRIEF DESCRIPTION OF THE DRAWINGS

FIGS. 2A–2G show the respective steps involved in the production of a multilayer wiring board according to an embodiment of the invention;

FIGS. 3A–3G show the respective steps involved in the production of a multilayer wiring board according to yet another embodiment of the invention;

FIGS. 4A–4G show the respective steps involved in the production of a multilayer wiring board according to a further embodiment of the invention;

DETAILED DESCRIPTION OF THE INVENTION

Preferred embodiments of the invention process for producing multilayer wiring boards will now be descried with reference to accompanying drawings.

Figure 1A:
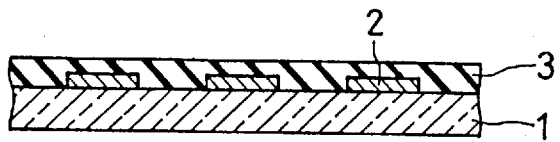
FIGS. 1A–1F show the respective steps involved in the production of a multilayer wiring board according to an embodiment of the invention.

FIGS. 1A–1F show an embodiment of the process. First, as shown in FIG. 1A, a substrate 1 is provided and a conductor pattern 2 is formed in a thickness of about 1–200 μm on the substrate 1, followed by the provision of an overlying interlevel dielectric layer 3.

The substrate 1 may be an insulating substrate selected form among various types which include, but are not limited to, glass-epoxy resin laminates, glass cloth-bismaleimide triazine resin laminates, glass cloth-polyimide resin laminates, paper-phenolic resin laminates, paper-cresol resin laminates, paper-phenolic novolak epoxy resin laminates and paper-cresol novolak epoxy resin laminates. If desired, the surface of the substrate 1 may be roughened.

The conductor pattern 2 is typically formed of a conductive material such as Cu, Al, Ag, Au or Ni and can be provided by any known means. In the present invention, Cu and Al are preferred since they have a certain degree of elasticity, are inexpensive and will not easily wear out by sand blasting.

The interlevel dielectric layer 3 is provided on the substrate 1 by the following procedure: the ingredients of a material for forming the dielectric layer are dissolved, dispersed and mixed thoroughly with a suitable device such as a triple-roll mill, a ball mill or a sand mill and the mix is applied onto the substrate by a suitable means such as screening, dip coater, bar coater, roll coater, reverse coater, spin coater, curtain flow coater or spray coater to give a dry film thickness of about 10–100 μm and, after drying either at room temperature or within a warm heater or an IR heater, the film is cured by irradiation with activation energy rays from an ultrahigh-pressure mercury vapor lamp, a chemical lamp or the like or by heating in a warm air heater or an IR heater at a temperature of about 120–200° C.

The material for forming the interlevel dielectric layer 3 is typically a composition containing a binder resin, a thermal or photopolymerization initiator or crosslinking agent, and a thermal or photopolymerizable monomer. The monomer may be omitted if the binder resin contains groups that can be polymerized or crosslinked with light or heat.

Examples of the binder resin include: copolymers of monomers selected from among methyl acrylate, methyl methacrylate, ethyl acrylate, ethyl methacrylate n-butyl acrylate, n-butyl methacrylate, isobutyl acrylate, isobutyl methacrylate, 2-ethylhexyl acrylate, 2-ethylhexyl methacrylate, benzyl acrylate, benzyl methacrylate, 2-hydroxyethyl acrylate, 2-hydroxyethyl methacrylate, 2-hydroxypropyl acrylate, 2-hydroxypropyl methacrylate, ethylene glycol monomethyl ether acrylate, ethylene glycol monomethyl ether methacrylate, ethylene glycol monoethyl ether acrylate, ethylene glycol monoethyl ether methacrylate, glycerol monoacrylate, glycerol monomethacrylate, acrylic acid dimethylaminoethyl ester, methacrylic acid dimethylaminoethyl ester, tetrahydrofurfuryl acrylate tetrahydrofurfuryl methacrylate, acrylic acid amide, methacrylic acid amide, acrylonitrile, methacrylonitrile, etc.; bisphenol A type epoxy resin, bisphenol F type epoxy resin, bisphenol S type epoxy resin, phenol novolak type epoxy resin, cresol novolak type epoxy resin, epoxidized resins formed by condensation of phenols with aromatic aldehydes having a phenolic hydroxyl group, urea resins, melamine resins, triazine resins such as tris-(2, 3-diepoxypropyl)isocyanurate, cyclotene resins of Dow Chemical Corporation, polyphenolic resins, polynovolak resins, polyamide resins, polyimide resins; etc. Among these, epoxy resins, polyphenolic resins, polynovolak resins, polyamide resins and polyimide resins are used with advantage since they will not deteriorate or decompose even at high temperatures of about 150–200° C., have tensile strength exceeding 1 kg in terms of peeling strength and exhibit salient resistance to heat and chemicals.

The above-mentioned monomers may be copolymerized with other monomers having a carboxyl group such as acrylic acid, methacrylic acid, crotonic acid, isocrotonic acid, angelic acid, tiglic acid, 2-ethyl acrylate, 3-propyl acrylate, 3-isopropyl acrylate, succinic acid monohydroxyethyl acrylate, phthalic acid monohydroxyethyl acrylate, dihydrophthalic acid monohydroxyethyl acrylate, tetrahydrophthalic acid monohydroxyethyl acrylate, hexahydrophthalic acid monohydroxyethyl acrylate, acrylic acid dimer and acrylic trimer; it should, however, be noted that copolymerization with these monomers may sometimes yield resins having lower heat resistance, chemical resistance and insulation resistance.

Examples of the thermal or photopolymerization initiator include: 1-hydroxycyclohexyl phenyl ketone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2methyl-1-phenylpropan-1-one, 2,4,6-trimethylbenzoyldiphenyl phosphine oxide, 1-[4-(2-hydroxyethoxy)-phenyl]-2-hydroxy-2-methyl-1-propan-1-one, 2,4-diethylthioxanthone, 2-chlorothioxanthone, 2,4-dimethylthioxanthone, 3,3-dimenthyl-4-methoxybenzophenone, benzophenone, 1-chloro-4-propoxythioxanthone, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethyl sulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2-diethoxyacetophenone, benzyl dimethyl ketal, benzyl-β-methoxyethyl acetal, 1-phenyl-1,2-propanedion-2-(o-ethoxycarbonyl)oxime, methyl o-benzoylbenzoate, bis(4-dimethylaminophenyl)ketone, 4,4'-bisdiethylaminobenzophenone, 4,4'-dichlorobenzophenone, benzil, benzoin, benzoin methyl ether, benzoin ethyl ether, benzoin isopropyl ether, benzoin n-butyl ether, benzoin isobutyl ether, benzoin butyl ether, p-dimethylaminoacetophenone, p-tertbutyltrichloroacetophenone, p-tert-butyldichloroacetophenone, thioxanthone, 2-methyl thioxanthone, 2-isopropyl thioxanthone, dibenzosuberone, α,α-dichloro-4-phenoxyacetophenone and pentyl-4-dimethylaminobenzoate. These thermal or photopolymerization initiators may be contained in amounts of 0.1–40 parts by weight in 100 parts by weight of the binder resin.

Examples of the crosslinking agent include: dicyandiamide; imidazole compounds such as 2-ethyl-4-methylimidazole, 1-cyanoethyl-2-ethyl-4-methylimidazole, 2,4-diamino-6-[2'-methylimidazolyl-(1)]-ethyl-s-triazine, 2,4-diamino-6-[2'-ethyl-4-methylimidazolyl-(1)]-ethyl-s-triazine-isocyanuric acid adduct, 2-methylimidazole, 1-phenyl-2-methylimidazole and 2-phenyl-4-methyl-5-hydroxymethylimidazole; triazine compounds such as 2,4-diamino-6-vinyl-s-triazine-isocyanuric acid adduct, 2-vinyl-4,6-diamino-s-triazine, 2-methoxyethyl-4,6-diamine-s-triazine and 2-o-cyanophenyl-4,6-diamino-s-triazine; urea compounds such as 3-(3,4-dichlorophenyl)-1,1'-dimethylurea, 1,1'-isophorone-bis(3-methyl-3-hydroxyethylurea) and 1,1'-tolylene-bis(3,3-dimethylurea); aromatic amino compounds such as 4,4'-diaminodiphenylmethane; and photo-cationic polymerization catalysts such as triphenylsulfonium hexafluorophosphate, triphenylsulfonium hexafluoroantimonate, triphenylselenium hexafluorophosphate, triphenylselenium hexafluoroantimonate, diphenyliodonium hexafluoroantimonate, disphenyliodonium hexafluorophosphate and 2,4-cyclopentadien-1-yl-[(1-methylethyl)-benzene]-Fe-hexafluorophosphate (e.g., "IRGACURE-261" of Ciba-Geigy). Among these, dicyandiamide, 2,4-diamino-6-[2'-methylimidazoyl-(1)]-ethyl-s-triazine, 2-ethyl-4-methylimidazole, 1,1'-isophorone-bis(3-methyl-3-hydroxyethylurea), 1,1'-tolylene-bis(3,3-dimethylyrea), 3-(3,4-dichlorophenyl)-1,1'-dimethylurea and commercial photo-cationic polymerization catalysts (e.g., "SP-150" and "SP-170" both available from Asahi Denka Kogyo K.K.).

Examples of the thermal or photopolymerizable monomer include: monofunctional monomers such as 2-hydroxyethyl acrylate, 2-hydroxyethyl methacrylate, ethylene glycol monomethyl ether acrylate, ethylene glycol monomethyl ether methacrylate, ethylene glycol monoethyl ether acrylate, ethylene glycol monoethyl ether methacrylate, glycerol acrylate, glycerol methacrylate, acryic acid amide, methacrylic acid amide, acrylonitrile, methacrylonitrile, methyl acrylate, methyl methacrylate, ethyl acrylate, ethyl methacrylate, isobutyl acrylate, isobutyl methacrylate, 2-ethylhexyl acrylate, 2-ethylhexyl methacrylate, benzyl acrylate and benzyl methacrylate; and polyfunctional monomers such as ethylene glycol diacrylate, ethylene glycol dimethacrylate, triethylene glycol diacrylate, triethylene glycol dimethacrylate, tetraethylene glycol diacrylate, tetraethylene glycol dimethacrylate, butylene glycol dimethacrylate, propylene glycol diacrylate, propylene glycol dimethacrylate, trimethylolpropane triacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, 1,6-hexanediol diacrylate, 1,6-hexanediol dimethacrylate, cardoepoxy diacrylate and cardoepoxy dimethacrylate. These thermal or photopolymerizable monomers are preferably incorporated in amounts of up to 50 parts by weight into 100 parts by weight of the composition for the interlevel dielectric layer.

Besides the ingredients described above, the material for forming the interlevel dielectric layer may incorporate inorganic fillers such as silica, alumina, mica and talc in order to maintain dimensional stability, chemical resistance, heat resistance and insulating property, as well as heat-resistant organic color pigments such as phthalocyanine green that assist in quick identification of via holes after sandblasting.

The particle size of the inorganic fillers is selected from the range of about 0.01 to 500 μm; preferably, a plurality of fillers having different shapes and particle sizes within the stated range are selectively contained in order to increase the adhesion strength between the interlevel dielectric layer and the conductive layer which is to be formed after sandblasting.

The material for forming the interlevel dielectric layer 3 may also contain a leveling agent, an anti-foaming agent, a solvent and the like in order to assure uniform application of the material by such means as screening, dip coater, roll coater, spin coater, curtain flow coater or spray coater.

Examples of the solvent include: methyl ethyl ketone, acetone, methyl isobutyl ketone, diethyl ketone, cyclohexanone, ethylene glycol monoethyl ether, ethylene glycol monoethyl ether, ethylene glycol monobutyl ether, ethylene glycol monobenzyl ether, ethylene glycol monophenyl ether, diethylene glycol monoethyl ether, diethylene glycol monobutyl ether, propylene glycol monoethyl ether, propylene glycol monoethyl ether, dipropylene glycol monoethyl ether, dipropylene glycol monoethyl ether, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, diethylene glycol monoethyl ether acetate and diethylene glycol monobutyl ether acetate. Among these, propylene glycol monoethyl ether, propylene glycol monoethyl ether, propylene glycol monopropyl ether, dipropylene glycol monomethyl ether, dipropylene glycol monoethyl ether, dipropylene glycol monopropyl ether and propylene glycol monomethyl ether acetate are used with particular advantage since they are safe to humans and permit smooth application of coatings.

The composition for forming the interlevel dielectric layer 3 may also incorporate a sulfur-containing organic compound as a catalyst poison. Examples of the sulfur-containing organic compound include 2-mercaptobenzothiazole, dibenzothiazyl disulfide, N-tert-butyl-2-benzothiazolyl sulfenamide and tetramethylthiraum disulfide. After via holes are formed in the interlevel dielectric layer 3 by the method to be described later, the conductive layer is provided within the via holes by plating and the catalyst poison in the interlevel dielectric layer 3 can prevent the conductor layer from sticking on to the dielectric layer 3. The sulfur-containing organic compound is preferably incorporated in an amount of 0.1–20 parts by weight of the composition for the interlevel dielectric layer. Below 0.1 part by weight, the sulfur-containing organic compound is incapable of working as a catalyst poison; on the other hand, if the compound is contained in more than 20 parts by weight, the resulting resin may sometimes have lower heat resistance, chemical resistance and insulation resistance.

Figure 1B:
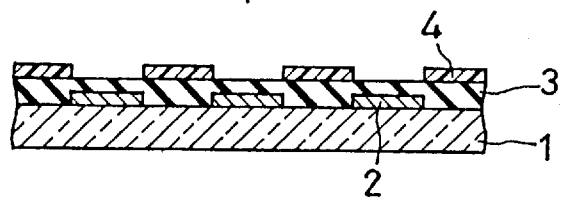
Figure 1C:
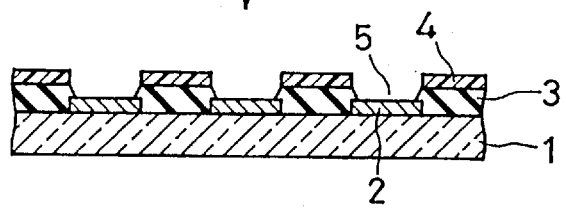

After hardening by thermal cure, the interlevel dielectric layer 3 is overlaid with a patterned coating 4 having resistance to sandblasting (see FIG. 1B).

The patterned coating 4 having resistance to sandblasting can be formed by various methods which include: printing a specified pattern by screening, bar coater, roll coater, reverse coater or curtain flow coater; or coating the interlevel dielectric layer 3 with a photosensitive resin having resistance to sandblasting or attaching a dry film of the resin onto the dielectric layer 3 and thereafter performing photolithography to provide a specified pattern. In the latter case of using a photosensitive resin, the applied or attached resin coating is exposed to activation energy rays from an ultrahigh-pressure mercury vapor lamp, a chemical lamp or the like through a mask and thereafter developed with a spray gun, by dipping or a like method. Depending on the type of photosensitive resin used, water or an aqueous alkali solution is preferably employed as the liquid developer and exemplary alkali components in the liquid developer include: hydroxides, carbonates, silicates, bicarbonates, phosphates and pyrophosphates of alkali metals such as sodium and potassium; primary amines such as benzylamine and butylamine; secondary amines such as dimethylamine, dibenzylamine and diethanolamine; tertiary amines such as trimethylamine, triethylamine and triethanolamine; cyclic amines such as morpholine, piperazine and pyridine; polyamines such as ethylenediamine and hexamethylenediamine; ammonium hydroxides such as tetraethylammonium hydroxide, trimethylbenzylammonium hydroxide, trimethylphenylbenzylammonium hydroxide and choline; and sulfonium hydroxides such as trimethylsulfonium hydroxide, diethylmethylsulfonium hydroxide and dimethylbenzylsulfonium hydroxide. Aqueous solutions of these substrates or buffered solutions thereof may be incorporated in liquid developers.

The coating having resistance to sandblasting may be formed of any material that can serve as a protective film against sandblasting and examples include: a photosensitive resin composition comprising an unsaturated polyester, an unsaturated monomer and a photopolymerization initiator as described in Unexamined Published Japanese Patent Application (kokai) No.103554/1980; a photosensitive resin composition comprising polyvinylalcohol and a diazo resin as described in Unexamined Published Japanese Patent Application (kokai) No. 69754/1990; and a photosensitive resin composition comprising a urethane(meth)acrylate oligomer, a water-soluble cellulosic resin, a photopolymerization initiator and a (meth)acrylate monomer. Among these, the photosensitive resin composition comprising a urethane (meth)acrylate oligomer, a water-soluble cellulosic resin, a photopolymerization initiator and a (meth)acrylate monomer is preferably used since it has good adhesion to the interlevel dielectric layer and features high flexibility. The light-sensitive resins for forming the patterned coating having resistance to sandblasting may be applied as a dry film.

After forming the sandblast-resistant patterned coating 4, sandblasting is performed to remove the interlevel dielectric layer 3 in selected areas, thereby forming inwardly tapered via holes 5 (see Fig. IC).

The medium for sandblasting is fine (ca. 0.1–150 $\mu$m) particulate materials such as glass beads, alumina, silica, silicon carbide and zirconium oxide particles; these materials are blown at a blast pressure of 0.5–5 kg/cm$^2$ to effect sandblasting. Compared to ordinary photosensitive resins, the coating 4 has sufficiently high elasticity and flexibility to withstand the wear by sandblasting and, hence, it will not wear out before via holes of a desired depth are formed.

According to the invention, inwardly tapered via holes 5 are formed by sandblasting the interlevel dielectric layer 3 and, therefore, unlike in the case of employing conventional photolithographic techniques, the occurrence of side etching can be prevented to ensure that a conductive layer is deposited efficiently on the sidewall of via holes during plating in a subsequent step and, as a result, the peeling strength between the conductive layer and the interlevel dielectric layer is markedly improved to realize the manufacture of multilayer wiring boards of high reliability which are less likely to experience the open-circuit problem (broken metal interconnecting lines) and cracking. What is more, the process of the invention does not use any strong acids (e.g. chromic acid) as oxidizers and, hence, presents no potential hazard to the environment.

Figure 1D:
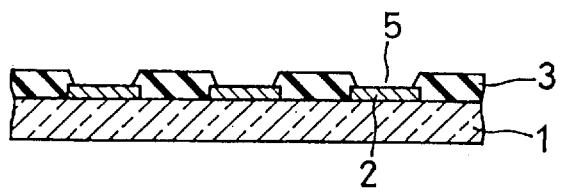

After the sandblasting, the coating 4 is stripped away with an aqueous solution of sodium hydroxide, potassium hydroxide, an organic amine or the like at a pH of about 12–14 (see FIG. 1D).

Subsequently, a conductive layer 7 is formed as shown in either FIG. 1E or 1F. The formation of the conductive layer 7 can be accomplished by electroless plating or direct electroplating. Direct electroplating is less time-consuming and, hence, enables more efficient fabrication than electroless plating. On the other hand, electroless plating has the advantage of simplicity in the preparation and supply of plating baths. Another method for forming the conductive layer 7 is to apply a conductive paste composition onto the necessary areas or filling them with the paste composition by screening or other suitable techniques.

An example of the electroless plating method is to dip the substrate for about 10 min to 10 h within a plating bath consisting typically of an aqueous solution of copper sulfate, formaldehyde, EDTA and sodium hydroxide.

An example of the direct electroplating method is specifically performed as follows: first, a surface of the interlevel dielectric layer 3 is micro-etched by oxidation, which may be performed by dipping the substrate in an aqueous solution containing about 1–10% of sodium or potassium permanganate and about 0.5–5% of potassium or sodium hydroxide at a temperature of about 50–95° C. for about 1–15 min. A surfactant may be added to the aqueous solution as required.

After the oxidation, the interlevel dielectric layer 3 is neutralized, washed with water and treated with an aqueous solution of palladium colloid, whereupon the surface of the substrate is sufficiently activated to ensure better adhesion to the plate layer to be subsequently formed. In order to have better dispersibility, the palladium colloid has preferably a particle size of about 0.01–1 $\mu$m and its concentration is preferably about 0.5–10 g/L If desired, the aqueous solution of palladium colloid may contain at least one soluble compound of a metal (alloyed metal) selected from among silver, tin, indium, nickel, copper, gold, cobalt, zinc and cadmium, with tin sulfide being particularly preferred. A chelating agent may also be contained in order to chelate the palladium colloid and the soluble metal compound.

Any chelating agent may be used as long as it is capable of chelating palladium chloride and the alloyed metal compound. Exemplary chelating agents are bases including chelidamic acid, orotic acid, hydantoincarboxylic acid, succinimidocarboxylic acid, 2-pyrrolidone-5-carboxylic acid, carboxyhydroxypyridine, carboxycarprolactam, picolinic acid, dipicolinic acid, carboxyxanthine, quinolinecarboxylic acid or dicarboxylic acid, lignin, vaniline, 9-imidaziridone-4-carboxylic acid, ammonia, amine, amino acid, EDTA sodium chloride, ammonium hydroxide and other hydroxyl compounds (e.g. alkali hydroxides). Among these, chelidamic acid, orotic acid and 2-pyrrolidone-5-carboxylic acid are particularly preferred. The chelating agents listed above are used either singly or in combination. The chelating agents may be contained at such concentrations that the palladium colloid and the alloyed metal compound can be kept dispersed.

The electrolyte to be used in direct electroplating must be sufficiently alkaline to solubilize the chelating agent and the metal complex and it usually has a pH of about 8–14, desirably 12–14.

Contact with the palladium colloid can be effected at about 10–60° C., preferably about 30–50° C. A contact time of about 5–10 min will suffice for the purpose of the invention.

Following the oxidation, the substrate surface is thoroughly cleaned of the alkali deposit and the interlevel dielectric layer 3 is then subjected to electroplating, which may be performed by any of the conventionally known methods. A plating bath may be prepared from various compositions such as copper sulfate and copper pyrophosphate. By dipping the substrate in the plating bath for about 0.5–2 h at a current density of about 1–150 A/ft$^2$, the conductive layer 7 can be formed in a uniform thickness.

Figure 1E:
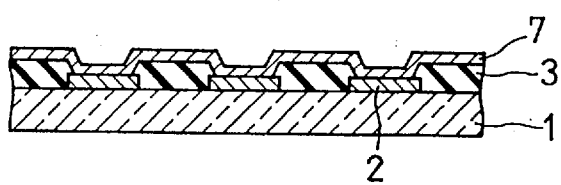
Figure 1F:
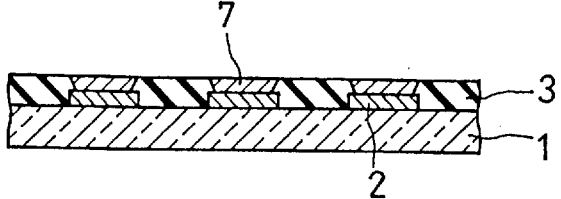

If the interlevel dielectric layer 3 does not contain a catalyst poison, the conductive layer 7 is formed as shown in FIG. 1E. If a catalyst poison is contained in the interlevel dielectric layer 7, the conductive layer 7 is formed only in the via holes as shown in FIG. 1F.

Subsequently, a second level of conductor pattern (not shown) is formed over the interlevel dielectric layer 3 and overlaid with another interlevel dielectric layer (also not shown), in which via holes (not shown) are formed. By forming a conductive layer (not shown), the fabrication of a multilayer wiring board is completed.

In another preferred embodiment of the invention, the surface of the interlevel dielectric layer 3 from which the sandblast-resistant coating 4 has been stripped may be roughened prior to plating. This embodiment is hereunder described with reference to FIGS. 2A–2G.

As in the process described above with reference to FIGS. 1A–1D, a conductor pattern and an interlevel dielectric layer 3 are provided on a substrate 1 and, then, a patterned coating 4 having resistance to sandblasting is formed and stripped away after forming via holes 5 by sandblasting (see FIGS. 2A–2D). Subsequently, the surface of the interlevel dielectric layer 3 is roughened as shown in FIG. 2E. This roughening step contributes a higher peeling strength between the interlevel dielectric layer 3 and the conductive layer 7 to be formed on it. The roughening of the interlevel dielectric layer 3 may be accomplished by known techniques of mechanical or chemical grinding or the combination of known mechanical and chemical grinding techniques. Examples of mechanical grinding techniques include brushing the surface of the interlevel dielectric layer 3 with Scotch Bright, a brass brush or the like, buffing treatment with a belt sander, as well as the sandblasting procedure already described above. An example of chemical grinding techniques is etching of the interlevel dielectric layer 3 in a solution of potassium permanganate if the dielectric layer 3 is made of an epoxy resin. Another example is microetching of the surface of the interlevel dielectric layer 3 by oxidation, which may be performed by dipping the substrate in an aqueous solution containing about 1–10% of sodium or potassium permanganate and about 0.5–5% of potassium or sodium hydroxide at a temperature of about 50–95° C. for about 1–15 min. A surfactant may be added to the aqueous solution as required.

The roughening of the interlevel dielectric layer 3 is preferable performed to provide an average surface roughness (Ra) of 0.1–10 μm.

After the roughening step, either direct electroplating or electroless plating is performed according to the procedure described in connection with FIG. 1E or 1F to form a conductive layer 7 as shown in FIG. 2F (if the interlevel dielectric layer does not contain a catalyst poison) or FIG. 2G (if a catalyst poison is contained only in the interlevel dielectric layer). Subsequently, a second level of conductor pattern (not shown) is formed over the interlevel dielectric layer 3 and overlaid with another interlevel dielectric layer (also not shown), in which via holes (not shown) are formed. By forming a conductive layer (not shown), the fabrication of a multilayer wiring board is completed.

In yet another preferred embodiment of the invention, the surface of the interlevel dielectric layer may be roughened prior to the formation of via holes. This embodiment is hereunder described with reference to FIGS. 3A–3G.

A conductor pattern 2 and an interlevel dielectric layer 3 are formed over a substrate 1 (see FIG. 3A); thereafter, the surface of the interlevel dielectric layer 3 is roughened (FIG. 3B) and the subsequent process goes in the same manner as described in connection with the preceding embodiments; namely, a patterned coating 4 having resistance to sandblasting is formed (FIG. 3C), then sandblasting is applied to remove selected areas of the interlevel dielectric layer 3 to form via holes 5 (FIG. 3D), thereafter the coating 4 is stripped away (FIG. 3E) and plating is performed to provide a conductive layer 7 as shown in FIG. 3F (if the interlevel dielectric layer does not contain a catalyst poison) of FIG. 3G (if it exclusively contains a catalyst poison).

The surface of the interlevel dielectric layer 3 may be roughened by any of the known methods described in connection with the second embodiment. The degree of roughening is preferably such that the interlevel dialectic layer 3 will have an average surface roughness (Ra) of 0.1–10 μm.

In the third embodiment, the preliminary roughened surface of the dielectric interlevel layer which have a better adhesion to the conductive layer which is to be provided on it and the peeling strength between the two layers is further enhanced to improve the quality and reliability of the final product. If the surface roughening of the interlevel dielectric layer 3 is effected after the sandblast resistant coating 4 has been stripped away from the dielectric layer 3 following the formation of via holes 5 by sandblasting, the medium that has been used in the surface roughening will scatter about on the interlevel dielectric layer 3 and must be cleaned before the conductive layer 7 is formed. In the embodiment shown in FIG. 3, the surface roughened interlevel dielectric layer 3 may be overlaid with the sandblast resistant coating 4 even if the medium that has scattered about in the surface roughening step remains unremoved because when the coating 1 is stripped away, the medium is also removed. Hence, there is no need to provide an additional step for cleaning the medium used in the surface roughening step and this contributes to simplification of the overall process.

FIGS. 4A–4G show still another embodiment of the invention. First, a conductor pattern 2 is formed in a thickness of about 1–200 μm over a substrate 1 and overlaid with a heat- or photocurable electrically insulating layer 3a (see FIG. 4A).

The heat- or photocurable electrically insulating layer 3a is provided on the substrate 1 by the following procedure: the ingredients of the starting material are dissolved, dispersed and mixed thoroughly with a suitable device such as a triple-roll mill, a ball mill or a sand mill and the mix is applied onto the substrate by a suitable means such as screening, bar coater, roll coater, reverse coater, curtain flow coater or spray coater to give a dry film thickness of about 10–100 μm. The applied insulating layer 3a is slightly cured by drying in a warm air heater or IR heater (FIG. 4B).

The insulating layer 3a may be formed of the same material as used to form the interlevel dielectric layer 3 in the preceding three embodiments. Stated specifically, the insulating layer 3a is generally formed of a composition containing a binder resin, a thermal or photopolymerization initiator or a crosslinking agent and a thermal or photopolymerizable monomer. The monomer may be omitted if the binder resin contains groups that can be polymerized or crosslinked with light or heat. For detailed information about the respective ingredients of the composition, see the foregoing description of the first embodiment.

What is unique about the embodiment shown in FIG. 4 is that the insulating layer 3a is not immediately heat cured to form the interlevel dielectric layer 3 but it remains slightly cured as it is overlaid with a patterned coating having resistance to sandblasting.

The term "slightly cured" means that the insulating layer 3a is cured to such an extent that the via holes formed by sandblasting in a subsequent step will not experience any morphological defects such as chipping, nicking and other loss of shape and also that the insulating layer 3a will not come off when the sandblast resistant coating is stripped or that the via holes formed in the insulating layer 3a will not be filled with the deforming mass of the insulating layer 3a when it is heat cured after the stripping of the sandblast resistant coating. In order to attain this "slightly cured" state, the insulting layer 3a may be irradiated with light of low energy dose or heated at a temperature slightly lower than the ordinary curing temperature; it is particularly preferred to heat the insulating layer 3a at a temperature of about 70–110° C. If the heating temperature is unduly low, the intended degree of "slight cure" is not achieved and the insulating layer may come off when the sandblast resistant coating is stripped in a subsequent step or the via holes formed in the insulating layer may be filled with the deforming mass of the insulating layer when it is heat cured after the stripping of the sandblast resistant coating. On the other hand, if the heating temperature is unduly high, the insulating layer will overcure and a prolonged time is required to complete the sandblasting operation.

The heat- or photocurable insulating layer 3a may incorporate a sulfur-containing organic compound as a catalyst poison. A suitable sulfur-containing organic compound may be selected from among the compounds already described in connection with the first embodiment.

In the next step, a patterned sandblast resistant coating 4 is formed on the slightly cured insulating layer 3a (see FIG. 4C). For detailed information about the sandblast resistant coating such as with respect to the ingredients of the coating material and the method of its formation, see the description of the first embodiment.

After forming the patterned sandblast resistant coating 4, the slightly cured insulating layer 3a is sandblasted such that selected areas of it are removed to form inwardly tapered via holes 5 (see FIG. 4D). As for the sandblasting medium and method, also see the description of the first embodiment. Compared to ordinary photosensitive resins, the coating 4 has sufficiently high elasticity and flexibility to withstand the wear by sandblasting and, hence, it will not wear out before via holes of a desired depth are formed.

In the fourth embodiment, the heat- or photocurable insulating layer 3a is sandblasted in a slightly cured state before it is fully cured and, hence, the blasting operation can be finished in a short time. In addition, the patterned sandblast resistant coating 4 can be formed in such a small thickness that if it is formed of a photosensitive resin, the depth of focus can be easily adjusted during exposure to enable the formation of a patterned coating that has higher resolution and, hence, better reproducibility.

As a further advantage, inwardly tapered via holes 5 are formed by sandblasting the insulting layer 3a and, therefore, unlike in the case of employing conventional photolithographic techniques, the occurrence of side etching can be prevented to ensure that a conductive layer is deposited efficiently on the sidewalls of via holes during plating in a subsequent step and, as a result, the peeling strength between the conductive layer and the interlevel dielectric layer (see below) is markedly improved to realize the manufacture of multilayer wiring boards of high reliability which are less likely to experience the open-circuit problem (breakage of metal interconnecting lines) and cracking. What is more, the process of the invention does not use any strong acids (e.g. chromic acid) as oxidizers and, hence, presents no potential hazard to the environment.

After the sandblasting, the coating 3 can be readily stripped away with an aqueous solution of sodium hydroxide, potassium hydroxide, an organic amine or the like at a pH of about 12–14 (see FIG. 4E).

In this stripping step, the slightly cure insulating layer 3a remains stable and will neither dissolve nor swell in the aqueous solution of sodium hydroxide, potassium hydroxide or an organic amine at a pH of about 12–14 and, hence, it will not be stripped away together with the patterned sandblast resistance coating 4.

Subsequently, the slightly cured insulating layer 3a is heat cured to form an interlevel dielectric layer 3. The heat cure is preferably accomplished by heating at a temperature in excess of 110° C. but not higher than about 200° C. in a warm air heater or IR heater or by irradiation with light such as UV rays.

If desired, the surface of the interlevel dielectric layer 3 may be roughened to provide an increased peeling strength between the dielectric layer 3 and the conductive layer to be subsequently formed on it. The roughening of the interlevel dielectric layer 3 may be accomplished by the aforementioned known techniques of mechanical or chemical grinding or the combination of known mechanical and chemical grinding techniques or by any other suitable techniques such as sandblasting. Needless to say, the slightly cured insulating layer 3a may be surface roughened before it is provided with the patterned sandblast resist coating.

After the roughening step, either direct electroplating or electroless plating is performed according to the procedure described in connection with FIG. 1E or 1F to form a conductive layer 7 as shown in FIG. 4F (if the interlevel dielectric layer does not contain a catalyst poison) or FIG. 4G (if a catalyst poison is contained only in the interlevel dielectric layer). Subsequently, a second level of conductor pattern (not shown) is formed over the interlevel dielectric layer 3 and overlaid with another interlevel dielectric layer (also not shown), in which via holes (not shown) are formed. By forming a conductive layer (not shown), the fabrication of a multilayer wiring board is completed.

The foregoing description concerns the case where via holes for establishing an electrical interconnection of more than one level of conductor patterns are formed by sandblasting. It should, however, be noted that via holes are not the only example of the channel for establishing an electrical interconnection of more than one level of conductor patterns and trench-like channels that run in continuous lines over the substrate, as well as through-holes may likewise be formed by sandblasting and plated with a conductive layer.

Alternatively, a conductive material may be buried in the trench-like channels formed by sandblasting; in this case, too, sandblasting effectively improves the adhesion and, hence, the peeling strength between the conductive material and the trench-like channels.

FIGS. 5A–5F show an example of the use of the multi-layer wiring board fabricated by the process of the invention. First, a substrate 1 having a conductor pattern formed thereon is overlaid with a first interlevel dielectric layer 3 incorporating a sulfur-containing compound and, after forming a patterned sandblast resistant coating (not shown) on the dielectric layer 3, the latter is sandblasted to form inwardly tapered trench-like channels (see FIGS. 5A and 5B).

Figure 5A:
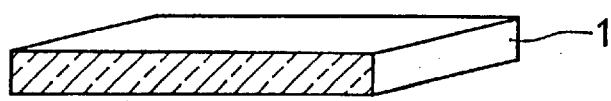
FIGS. 5A–5F show the respective steps involved in the production of a multilayer wiring board according to a still further embodiment of the invention.
Figure 5B:
Figure 5C:
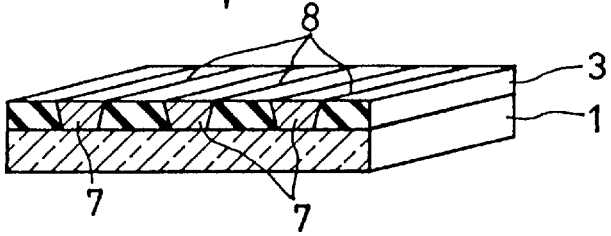

In the next step, a conductive layer 7 is formed within the trench-like channels 8 by either plating or burying a paste-like conductive material (see FIG. 5C).

Figure 5D:
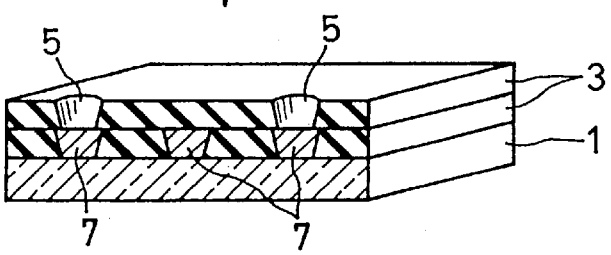

Subsequently, a second interlevel dielectric layer 3 is formed over the first interlevel dielectric layer 3 and similarly sandblasted to form via holes 5 (see FIG. 5D).

Figure 5E:
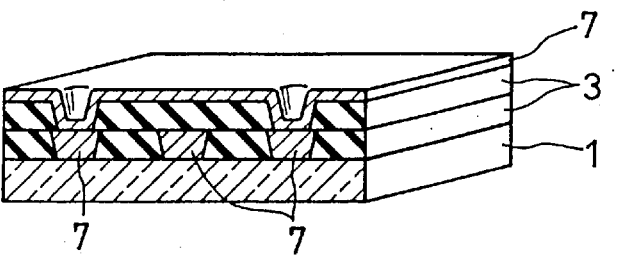

Then, a conductive layer 7 is formed over the second interlevel dielectric layer 3 and within the via holes 5 by plating (see FIG. 5E).

Figure 5F:
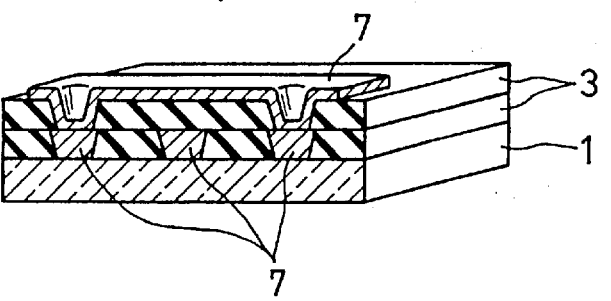
Figure 6:
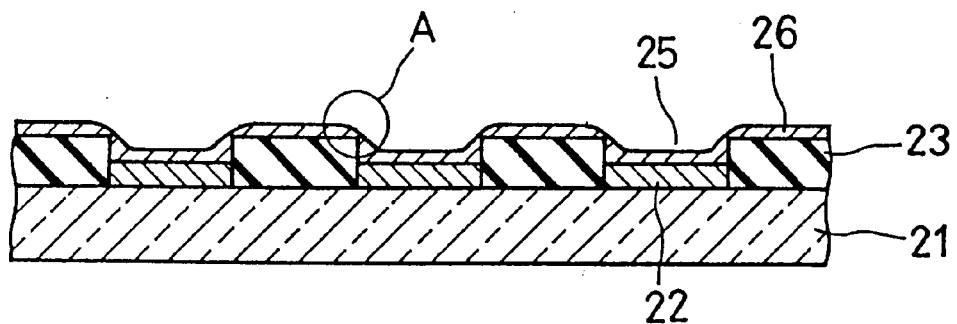
FIG. 6 shows an example of the multilayer wiring board produced by a prior art method.
Figure 7:
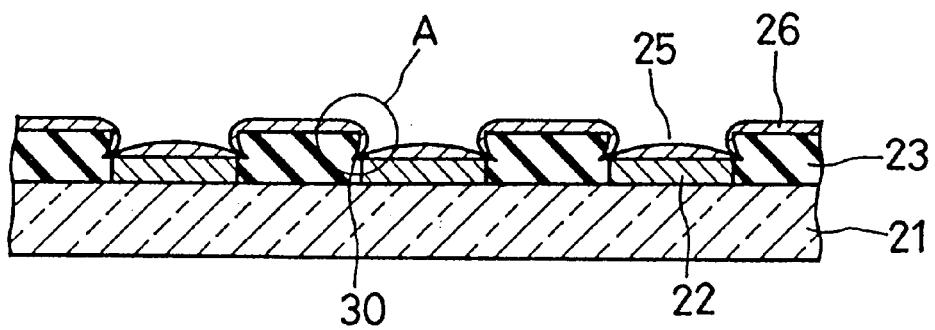
FIG. 7 shows another example of the multilayer wiring board produced by the prior art method.

Thereafter, the conductive layer 7 is etched to ensure that the conductive layer in the via holes 5 in the second interlevel dielectric layer 3 has an electrical connection to the conductive layer in the via holes 5 in the first interlevel dielectric layer (see FIG. 5F).

If desired, a third interlevel dielectric layer may be provided and channels may similarly be formed in it.

The following examples are provided for the purpose of further illustrating the present invention but are in no way to be taken as limiting.

EXAMPLES 1–4 AND COMPARATIVE EXAMPLES 1–3

The formulations shown in Table 1 (parts by weight) were provided as starting materials for making interlevel dielectric layers and blended on a triple-roll mill, thereby forming insulating compositions. Each of the composition was screen printed on a 1-mm thick glass-epoxy resin laminated substrate having a copper metallization pattern formed on it. The screen was made of a polyester and had an opening size of 100 mesh/inch and the dielectric coating had a dry thickness of 50 $\mu$m. In Examples 1 and 2, the applied dielectric coating was heat cured at 150° C. for 50 min; in Example 3, the coating was preliminarily dried at 80° C. for 50 min, subjected to full-frame exposure to UV light (500 mJ/cm$^2$) from an ultra-high-pressure mercury vapor lamp equipped exposing machine, "HTE 102S" of Hitec Products, Inc. and finally heat cured at 150° C. for 50 min.

TABLE 1

|  |  | Example | | | | Comparative Example | | |
|---|---|---|---|---|---|---|---|---|
|  |  | 1 | 2 | 3 | 4 | 1 | 2 | 3 |
| Binder resin | N-673 | 100 | — | — | 100 | — | — | 40 |
|  | EPIKOTE 828 | — | 100 | 100 | — | — | — | — |
|  | TEPIC-SP | — | — | — | — | 40 | — | — |
|  | TCR 1025 | — | — | — | — | 154 | 154 | 154 |
| Monomer | DPHA | — | — | 10 | — | 10 | 10 | 10 |
|  | TMPTA | — | — | 10 | — | 10 | 10 | 10 |
| Cross-linking agent | DICY | 7 | 9 | 9 | 7 | — | — | — |
|  | 2MZ.A | 6 | 6 | 6 | 6 | — | — | — |
| Photopolymerization initiator | IRGACURE-907 | — | — | 10 | — | 10 | 10 | 10 |
|  | KAYACURE-DETX | — | — | 5 | — | 5 | 5 | 5 |
| Solvent | DPM | — | — | — | — | 5 | 5 | 5 |
|  | SWAZOL 1500 | 10 | 5 | 5 | 10 | 5 | 5 | 5 |
|  | Diglycol acetate | 30 | 10 | 10 | 30 | — | — | — |
|  | PGMAc | — | — | — | — | — | — | 12 |
| Other additives | KS-66 | 2 | 2 | — | 2 | 2 | — | 2 |
|  | MODAFLOW | — | — | 2 | — | — | 2 | — |
|  | LIONOL GREEN 2YS | 2.5 | 2.5 | 2.5 | 2.5 | 2.5 | 2.5 | 2.5 |
|  | MICROACE P-4 | 10 | 10 | 10 | 10 | 10 | 10 | 10 |
|  | AEROSIL #200 | 2 | 2 | 2 | 2 | 2 | 2 | 2 |
|  | Barium sulfate B-31 | 60 | 60 | 60 | 60 | 80 | 60 | 80 |

The descriptions of the respective trade names in Table 1 are shown below.

N-673: o-cresol novolak epoxy resin (product of DIC Co., Ltd.)

EPIKOTE 828: Bisphenol A type epoxy resin product of Shell Chemical Co.)

TEPIC-SP: Triglycidyl ether isocyanurate (product of Nissan Chemical Industries, Ltd.)

TCR 1025: Triphenylmethane type epoxy acrylate acid anhydride adduct (acid value=100; diethylene glycol monomethyl ether acetate=25 wt %; SWAZOL 1500 (see below)=10 wt % (product of Nippon Kayaku Co., Ltd.)

DPHA: Dipentaerythritol hexaacrylate (product of Nippon Kayaku Co., Ltd.)

TMPTA: Trimethylolpropane triacrylate (product of Nippon Kayaku Co., Ltd.)

DICY: Dicyandiamide (epoxy curing agent) (product of Nippon Carbide Industries Co., Inc.)

2MZ•A: 2-Methyl imidazole azine (epoxy curing agent) (product of Shikoku Chemicals Corp.)

IRGACURE-907: 2-Methyl-[4-(methylthio)]phenyl-2-morpholino-1-propane (product of CIBA-GEIGY Corp.)

KAYACURE-DTEX: Diethylthioxanthone (product of Nippon Kayaku Kogyo Co., Ltd.)

DPM:: Dipropylene glycol monomethyl ether (product of Dow Chemical Co.)

SWAZOL 1500: Solvent naphtha (product of Maruzen Petrochemical Co, Ltd.)

Diglycol acetate: Diethylene glycol monoethyl ether acetate (product of Daicel Chemical Industries, Ltd.)

PGMAc: Propylene glycol monomethyl ether acetate (product of Dow Chemical Co.)

KS-66:: Silicone oil (product of Shin-Etsu Chemical Co., Ltd.)

MODAFLOW: Leveling agent (product of Monsanto Company)

LIONOL GREEN 2YS : Color pigment (product of Toyo Ink Mfg. Co., Ltd.)

MICROACE P-4: Talc (inorganic filler) (product of Nippon Talc Co., LTD)

AEROSIL #200: Fine particulate silica (product of Nippon Aerosil Co., Ltd.)

Barium sulfate B-31: Inorganic filler (product of Sakai Chemical Industry Co., Ltd.)

To each of the thus formed interlevel dielectric layers, a light-sensitive dry film, ORDYL BF-603 (product of Tokyo Ohka Kogyo Co., Ltd.), was applied as a sandblast resistant coating by thermocompression bonding at 70° C. The applied film was then irradiated with ultraviolet rays (300 mJ/cm$^2$) from an ultra-high-pressure mercury vapor lamp equipped exposing machine HTE 102S (product of Hitec Products, Inc.) through a predetermined mask pattern and spray developed with an aqueous solution of 0.2% sodium carbonate at 30° C. for 40 sec at a spray pressure of 1.2 kg/cm$^2$.

The substrate was then set up on a sandblasting machine SC-202 (product of Fuji Seisakusho K.K.) and the interlevel dielectric layer was sandblasted at a blast pressure of 2.5 kg/cm$^2$ for 6 min with silicon carbide particles (25 μm) used as a grinding medium. Subsequently, the sandblast resistant coating was stripped by spraying an aqueous solution of 3 wt % sodium hydroxide at 45° C. for 2 min.

After stripping the sandblast resistant coating, the substrate was washed with water, set up the same sandblasting machine and sandblasted with silicon carbide particles (25 μm) at a blast pressure of 2.5 kg/cm$^2$ for 1 min in order to roughen the surface of the interlevel dielectric layer and the inner surfaces of the via holes. The thus processed substrate was desmeared according to a SHIPLEY THERCUPOSIT 200MLB PROCESS and thereafter dipped in an electroless plating solution SHIPLEY CUPOIT 250 (product of Shipley Company Inc.) for 5 h to form conductive layer in a thickness of 25 μm.

In Example 4, the procedure of Example 1 was repeated except that after stripping the sandblast resistant coating, the substrate was washed with water and immediately dipped in the electroless plating solution to form a conductive layer in a thickens of 25 μm without roughening the surface of the interlevel dielectric layer and the inner surface of the via holes.

In Comparative Examples 1–3, the insulating composition was screened onto a 1-mm thick glass-epoxy resin laminated substrate to give a dry thickness of 50 μm and the applied coating was preliminarily dried at 80° C. for 50 min and irradiated with UV rays (500 mJ/cm$^2$) from the exposing machine HTE 102S (Hitec Products, Inc.) through a mask pattern. Then, the coating was spray developed with an aqueous solution of 1% sodium carbonate at 30° C. for 40 sec at a spray pressure of 1.2 kg/cm$^2$; thereafter, the substrate was set up on the same exposing machine and irradiated with UV rays (5 J/cm$^2$), followed by thermal cure at 150° C. for 50 min. After thusly forming via holes, the substrate was dipped an electroless plating solution (SHIPLEY CUPOSIT 250) to form a conductive layer in a thickness of 25 μm.

The individual substrate samples ware evaluated for the shape of via holes, the presence of undercuts, resistance to the heat of solder, insulation resistance and peeling strength by the following methods and criteria. The results are shown in Table 2.

Method and Criteria of Evaluation (Shape of via holes)

The substrate was cut across the thickness and a cross-sectional shape of via holes was examined.

(Undercut)

Via holes in the cut substrate were examined for its state at the junction between the interlevel dielectric layer and the overlying conductor pattern.

(Resistance to the heat of solder)

After application of a flux, the substrate was dipped 5 times in a soldering bath at 260° C., each time for 10 sec; the thus treated light-sensitive resin layer was examined for its state and evaluated by the following criterias: good, no change was observed after 5 dippings in the soldering bath; poor, part of the cured light-sensitive resin layer spalled after one dipping in the soldering bath.

(Insulation resistance)

The substrate was exposed to a hot and humid atmosphere (85° C.×90%) at a DC voltage of 100 volts and thereafter measured for its electrical resistance with a High Resistance Meter 4339A (product of Hewlett-packard Company); the result was differentiated as to whether the insulation resistance was higher than $1 \times 10^{12}$ Ω·cm($>10^{12}$) or less than $1 \times 10^{11}$ Ω·cm($<10^{11}$).

(Peeling strength)

Measurements were made in accordance with JIS H 8646.

TABLE 2

| | Example | | | | Comparative Example | | |
|---|---|---|---|---|---|---|---|
| | 1 | 2 | 3 | 4 | 1 | 2 | 3 |
| Shape of via holes | Inwardly tapered | Inwardly tapered | Inwardly tapered | Inwardly tapered | Rectangular | Rectangular | Outwardly tapered |
| Undercuts | No | No | No | No | Yes | Yes | Yes |
| Insulation resistance | $>10^{12}$ | $>10^{12}$ | $>10^{12}$ | $>10^{12}$ | $<10^{11}$ | $<10^{11}$ | $>10^{12}$ |
| Resistance to the heat of solder | Good | Good | Good | Good | Good | Poor | Poor |
| Peeling strength kg/cm | 2.0 | 1.9 | 1.8 | 0.7 | 0.7 | 0.7 | 0.6 |

EXAMPLE 5

Ten parts by weight of 2-mercaptobenzothiazole was added as a catalyst poison to the formulation of Example 1, which was then blended on a triple-roll mill, thereby forming an insulating composition. The composition was screen printed on a 1-mm thick glass-epoxy resin laminated substrate having a copper metallization pattern formed on it. The screen was made of a polyester and had an opening size of 100 mesh/inch and the dielectric coating had a dry thickness of 25 $\mu$m. The substrate was subsequently processed as in Example 1 to form via holes in selected areas of the interlevel dielectric layer, expect that the sandblasting time was 3 min. The thus processed substrate was desmeared according to a SHIPLEY THERCUPOSIT 200MLB PROCESS and thereafter dipped in an electroless plating solution SHIPLY CUPOSIT 250 (product of Shipley Company Inc.) for 5 h to fill each via hole with a conductive layer in a thickness of 25 $\mu$m. The surface of the interlevel dielectric layer had neither copper deposit nor discoloration due to the electroless plating but featured a very high degree of smoothness.

EXAMPLE 6

The insulating composition of Example 1 was screen printed on a 1-mm thick glass-epoxy resin laminated substrate having a copper metallization pattern formed on it. The screen was made of a polyester and had an opening size of 100 mesh/inch and the dielectric coating had a dry thickness of 20 $\mu$m. The applied dielectric coating was heat cured at 150° C. for 50 min to form an interlevel dielectric layer. To the thus formed interlevel dielectric layer, a light-sensitive dry film, ORDYL BF-603 (product of Tokyo Ohka Kogyo Co., Ltd.), was applied as a sandblast resistant coating by thermocompression bonding at 70° C. The applied film was then irradiated with ultraviolet rays (300 mJ/cm$^2$) from an ultrahigh-pressure mercury vapor lamp equipped exposing machine HTE 102S (product of Hitec Products, Inc.) through a mask pattern capable of reproducing 20 $\mu$m wide lines at spacings of 20 $\mu$m, and spray developed with an aqueous solution of 0.2% sodium carbonate at 30° C. for 40 sec at a spray pressure of 1.2 kg/cm$^2$.

Thereafter, the substrate was set up on a sandblasting machine SC-202 (product of Fuji Seisakusho K.K.) and the interlevel dielectric layer was sandblasted at a blast pressure of 2.5 kg/cm$^2$ for 2 min with silicon carbide particles (5 $\mu$m) used as a grinding medium. Subsequently, the sandblast resistant coating was stripped by spraying an aqueous of 3 wt % sodium hydroxide at 45° C. for 2 min.

After stripping the sandblast resistant coating, the substrate was set up on the same sandblasting machine and sandblasted with silicon carbide particles (5 $\mu$m) at a blast pressure of 2.5 kg/cm$^2$ for 10 sec in order to roughen the surface of the interlevel dielectric layer. The thus processed substrate was desmeared according to a SHIPLY THERCUPOSIT 200MLB PROCESS and thereafter dipped in an electroless plating solution SHIPLEY CUPOSIT 250 (product of Shipley Company Inc.) for 1 h to form a conductive layer in a thickness of 5 $\mu$m. Neither nicking nor delimitation occurred in the interlevel dielectric layer, and the channels experienced neither shorts nor conduction failure due to the breakage of metal interconnecting lines.

COMPARATIVE EXAMPLE 4

The insulating composition of Comparative Example 1 was screen printed on a 1-mm thick glass-epoxy resin laminated substrate having a copper metallization pattern formed on it. The screen was made of a polyester and opening size 100 mesh/inch and the dielectric coating had a dry thickness of 20 $\mu$m. The applied dielectric coating was dried preliminarily at 80° C. for 50 min and irradiated with ultraviolet rays (500 mJ/cm$^2$) from an ultrahigh-pressure mercury vapor lamp equipped exposing machine HTE 102S (product of Hitec Products, Inc.) through a mask pattern capable of reproducing 20 $\mu$m wide lines at spacings of 20 $\mu$m, and spray developed with an aqueous solution of 1% sodium carbonate at 30° C. for 40 sec at a spray pressure of 1.2 kg/cm$^2$. Partial nicking occurred in the interlevel dielectric layer. After irradiation with UV rays (2 mJ/cm$^2$) from the same exposing machine, the interlevel dielectric layer was heat cured at 150° C. for 50 min. The thus processed substrate was subjected to electroless plating by dipping in SHIPLEY CUPOSIT 250 for 1 h, whereupon a conductive layer was formed in a thickness of 5 $\mu$m. Some channels experienced shorts.

EXAMPLE 7–9 AND COMPARATIVE EXAMPLES 5–7

In Example 7, the Formulation of Example 1 was used as a starting material for making an interlevel dielectric layer; in Examples 8 and 9 and in Comparative Example 5–7, the formulations of Examples 2 and 3 and Comparative Examples 1–3 were respectively used as starting materials. Each formulation was blended on a triple-roll mill to form an insulating composition. The composition was screen printed on a 1-mm thick glass-epoxy resin laminated substrate having a copper metallization pattern formed on it. The screen was made of a polyester and had an opening size of 100 mesh/inch and the dielectric coating had a dry thickness of 50 $\mu$m. In Examples 7 and 8, the applied dielectric coating was heat cured at 150° C. for 50 min; in Example 9, the coating was preliminarily dried at 80° C. for 50 min, subjected to full-frame exposure to UV light (500 mJ/cm$^2$) from an ultrahigh-pressure mercury vapor lamp equipped exposing machine, "HTE 102 S" of Hitec Products, Inc., and finally heat cured at 150° C. for 50 min.

To each of the thus formed interlevel dielectric layers, a light-sensitive dry film, ORDYL BF-603 (product of Tokyo Ohka Kogyo Co., Ltd.), was applied as a sandblast resistant coating by thermocompression bonding at 70° C. The applied film was then irradiated with ultraviolet rays (300 mJ/cm$^2$) from HTE 102S through a predetermined mask pattern and spray developed with an aqueous solution of 0.2% sodium carbonate at 30° C. for 40 sec at a spray pressure of 1.2 kg/cm$^2$.

Thereafter, the substrate was set up on a sandblasting machine SC-202 (product of Fuji Seisakusho K.K.) and the interlevel dielectric layer was sandblasted at a blast pressure of 2.5 kg/cm$^2$ for 6 min with silicon carbide particles (25 $\mu$m) used as a grinding medium. Subsequently, the sandblast resistant coating was stripped by spraying an aqueous solution of 3 wt % sodium hydroxide at 45° C. for 2 min.

After stripping the sandblast resistant coating, the substrate was washed with water, set up on the same sandblasting machine and sandblasted with silicon carbide particles (25 $\mu$m) at a blast pressure of 2.5 kg/cm$^2$ for 1 min in order to roughen the surface of the interlevel dielectric layer and the inner surface of the via holes. The thus processed substrate was dipped in an aqueous solution of sodium hydroxide (10 g/L) for 5 min at a temperature of 50° C.

before micro-etching was applied by dipping in an aqueous solution of the following formulation at 80° C. for 6 min.
(Micro-etching solution)

| | |
|---|---|
| Potassium permanganate | 50 g |
| Potassium hydroxide | 20 g |
| Water | 1,000 g |

Thereafter, the substrate was subjected to copper plating in a copper pyrophosphate bath for its formulation, see below) under the conditions also set below.
(Plating bath)

| | |
|---|---|
| copper pyrophosphate | 60–80 g/L |
| Potassium pyrophosphate | 250–400 g/L |
| aqueous ammonia | 0.5–1 mL/L |
| Gloss agent | q. s. |

(Plating conditions)

| | |
|---|---|
| Temperature | 50–60° C. |
| Current density at cathode | 30–50 A/ft$^2$ |

The copper plating allowed a conductive layer to be formed in a thickness of 25 μm on the substrate surface. The plating time was 35 min.

In Comparative Examples 5–7 the insulating composition was screened onto a 1-mm thick glass-epoxy resin laminated substrate to give a dry thickness of 50 μm and the applied coating was preliminarily dried at 80° C. for 50 min and irradiated with UV rays (500 mJ/cm$^2$) from the exposing machine HTE 102S (Hitec Products, Inc.) through a mask pattern. Then, the coating was spray developed with an aqueous solution of 1% sodium carbonate at 30° C. for 40 sec at a spray pressure of 1.2 kg/cm$^2$; thereafter, the substrate was set up on the same exposing machine and irradiated with UV rays (5 J/cm$^2$), followed by thermal cure at 150° C. for 50 min.

In Comparative Examples 5 and 7, the thus processed substrate was dipped in an aqueous solution of sodium hydroxide (10 g/L) for 5 min at a temperature of 50° C. before micro-etching was applied by dipping in an aqueous solution of the following formulation at 80° C. for 6 min.
(Micro-etching solution)

| | |
|---|---|
| Potassium permanganate | 50 g |
| Potassium hydroxide | 20 g |
| Water | 1,000 g |

Thereafter, the substrates were subjected to electroless copper plating in the following bath.
(Plating bath)

| | |
|---|---|
| Copper (supplied as copper sulfate) | 2.8 g/L |
| Formaldehyde | 3.5 g/L |
| Sodium hydroxide | 10–11 g/L |
| EDTA | q. s. |

The electroless copper plating allowed a conductive layer to be formed in a thickness of 25 μm over the substrate surface. The plating time was 15 h.

The individual substrate samples were evaluated for the shape of via holes, the presence of undercuts, resistance to the heat of solder, insulation resistance and peeling strength by the methods and criteria already described above. The results are shown in Table 3.

TABLE 3

| | Example | | | Comparative Example | | |
|---|---|---|---|---|---|---|
| | 7 | 8 | 3 | 5 | 6 | 7 |
| Shape of via holes | Inwardly tapered | Inwardly tapered | Inwardly tapered | Trapezoidal | Trapezoidal | Trapezoidal |
| Undercuts | No | No | No | Yes | Yes | Yes |
| Insulation resistance | >10$^{12}$ | >10$^{12}$ | >10$^{12}$ | <10$^{11}$ | <10$^{11}$ | >10$^{12}$ |
| Resistance to the heat of solder | Good | Good | Good | Good | Poor | Poor |
| Peeling strength kg/cm | 1.2 | 1.0 | 1.0 | 0.4 | 0.4 | 0.4 |

EXAMPLE 10

Ten parts by weight of 2-mercaptobenzothiazole was added as a catalyst poison to the formulation of Example 7, which was then blended on a triple-roll mill, thereby forming an insulating composition. The composition was screen printed on a 1-mm thick glass-epoxy resin laminated substrate having a copper metallization pattern formed on it. The screen was made of a polyester and had an opening size of 100 mesh/inch and the dielectric coating had a dry thickness of 25 μm. The substrate was subsequently processed as in Example 7 to form via holes in selected areas of the interlevel dielectric layer, except that the sandblasting time was 3 min. The substrate was then given a preliminary treatment for micro-etching, micro-etched and subjected to direct electroplating as in Example 7, whereby the via holes were filled with a conductive layer in a thickness of 25 μm. The surface of the interlevel dielectric layer had neither copper deposit nor discoloration due to the electroplating but featured a very high degree of smoothness. The time was 20 min.

EXAMPLE 11

The insulating composition of Example 1 was screen printed on a 1-mm thick glass-epoxy resin laminated substrate having a copper metallization pattern formed on it. The screen was made of a polyester and had an opening size of 100 mesh/inch and the dielectric coating had a dry thickness of 20 μm. The applied dielectric coating was heat cured at 150° C. for 50 min to form an interlevel dielectric layer. To the thus formed interlevel dielectric layer, a light-sensitive dry film, ORDYL BF-603 (product of Tokyo Ohka Kogyo Co., Ltd.), was applied as a sandblast resistant coating by thermocompression bonding at 70° C. The applied film was then irradiated with ultraviolet rays (300 mJ/cm$^2$) from an ultrahigh-pressure mercury vapor lamp equipped exposing machine HTE 102S (product of Hitec Products, Inc.) through a mask pattern capable of reproducing 20 μm wide lines at spacings of 20 μm, and spray developed with an aqueous solution of 0.2% sodium carbonate at 30° C. for 40 sec at a spray pressure of 1.2 kg/cm$^2$.

Thereafter, the substrate was set up on a sandblasting machine SC-202 (product of Fuji Seisakusho K.K.) and the interlevel dielectric layer was sandblasted at a blast pressure of 2.5 kg/cm² for 2 min with silicon carbide particles (5 μm) used as a grinding medium. Subsequently, the sandblast resistant coating was stripped by spraying an aqueous solution of 3 wt % sodium hydroxide at 45° C. for 2 min.

After stripping the sandblast resistant coating, the substrate was set up on the same sandblasting machine and sandblasted with silicon carbide particles (5 μm) at a blast pressure of 2.5 kg/cm² for 10 sec in order to roughen the surface of the interlevel dielectric layer. The thus processed substrate was given a preliminary treatment for microetching, micro-etched and subjected to direct electroplating as in Example 7, whereby a conductive layer was formed in a thickness of 5 μm within the via holes. Neither nicking nor delamination occurred in the interlevel dielectric layer, and the channels experienced neither shorts nor conduction failure due to the breakage of metal interconnecting lines. The plating time was 7 min.

COMPARATIVE EXAMPLE 8

The insulating composition of Comparative Example 5 was screen printed on a 1-mm thick glass-epoxy resin laminated substrate having a copper metallization pattern formed on it. The screen was made of a polyester and had an opening size of 100 mesh/inch and the dielectric coating had a dry thickness of 20 μm. The applied dielectric coating was dried preliminarily at 80° C. for 50 min and irradiated with ultraviolet rays (500 mJ/cm²) from an exposing machine HTE 102S (product of Hitec Products, Inc.) through a mask pattern capable of reproducing 20-μm wide lines at spacings of 20 μm, and spray developed with an aqueous solution of 1% sodium carbonate at 30° C. for 40 sec at a spray pressure of 1.2 kg/cm². Partial nicking occurred in the interlevel dielectric layer. After irradiation with UV rays (2 J/cm²) from the same exposing machine, the interlevel dielectric layer was heat cured at 150° C. for 50 min. The thus processed substrate was subjected to electroless plating by dipping in SHIPLEY CUPOSIT 250 for 1 h as in Comparative Examples 5–7, whereupon a conductive layer was formed in a thickness of 5 μm. Some channels experienced shorts.

EXAMPLE 14

In Example 12, the formulation of Example 1 was used as a starting material for making an interlevel dielectric layer; in Example 13 and 14, the formulations of Examples 2 and 3 were respectively used as starting materials. Each formulations was blended on a triple-roll mill to form an insulating composition. The composition was screen printed on a 1-mm thick glass-epoxy resin laminated substrate having a copper metallization pattern formed on it. The screen was made of a polyester and had an opening size of 100 mesh/inch and the dialectic coating had a dry thickness of 50 μm. In Examples 12 and 13, the applied dielectric coating was heat cured at 150° C. for 50 min; in Example 14, the applied dielectric coating was dried preliminarily at 80° C. for 50 min, subjected to full-frame exposure to UV light (500 mJ/cm²) from an ultrahigh-pressure mercury vapor lamp equipped exposing machine, "HTE 102S" of Hitec Products, Inc., and finally heat cured at 150° C. for 50 min.

Subsequently, the surface of the interlevel dielectric layer was roughened by buffing to an average surface roughness (Ra) of 4 μm.

To each of the surface roughened interlevel dielectric layers, a light-sensitive dry film, ORDYL BF-603 (product of Tokyo Ohka Kogyo Co., Ltd.), was applied as a sandblast resistant coating by thermocompression bonding at 70° C. The applied film was then irradiated with ultraviolet rays (300 mJ/cm²) from HTE 102S through a predetermined mask pattern and spray developed with an aqueous solution of 0.2% sodium carbonate at 30° C. for 40 sec at a spray pressure of 1.2 kg/cm².

Thereafter, the substrate was set up on a sandblasting machine SC-202 (product of Fuji Seisakusho K.K.) and the interlevel dielectric layer was sandblasted at a blast pressure of 2.5 kg/cm² for 6 min with silicon carbide particles (25 μm) used as a grinding medium. Subsequently, the sandblast resistant coating was stripped by spraying an aqueous solution of 3 wt % sodium hydroxide at 45° C. for 2 min.

After stripping the sandblast resistant coating, the substrate was desmeared according to SHIPLEY THERCUPOSIT 200MLB PROCESS and then dipped in an electroless plating solution SHIPLEY CUPOSIT 250 (Shipley Company Inc.) for 5 h to form a conductive layer in a thickness of 25 μm.

The individual substrate samples were evaluated for the shape of via holes, the presence of undercuts, resistance to the heat of solder, insulation resistance and peeling strength by the methods and criteria already described above. The results are shown in Table 4.

TABLE 4

|  | Example | | |
| --- | --- | --- | --- |
|  | 12 | 13 | 14 |
| Shape of via holes | Inwardly tapered | Inwardly tapered | Inwardly tapered |
| Undercuts | No | No | No |
| Insulation resistance | >10¹² | >10¹² | >10¹² |
| Resistance to the heat of solder | Good | Good | Good |
| Peeling strength kg/cm | 2.0 | 1.9 | 1.8 |

EXAMPLE 15

Ten parts by weight of 2-mercaptobenzothiazole was added as a catalyst poison to the formulation of Example 12, which was then blended on a triple-roll mill, thereby forming an insulating composition. The composition was screen printed on a 1-mm thick glass-epoxy resin laminated substrate having a copper metallization pattern formed on it. The screen was made of a polyester and had an opening size of 100 mesh/inch and the dielectric coating had a dry thickness of 25 μm. The substrate was subsequently processed as in Example 12 to form via holes in selected areas of the interlevel dielectric layer, except that the sandblasting time was 3 min. The thus processed substrate was desmeared according to a SHIPLEY THERCUPOSIT 200MLB PROCESS and thereafter dipped in an electroless plating solution SHIPLEY CUPOSIT 250 (product of Shipley Company Inc.) for 5 h to fill each via hole with a conductive layer in a thickness of 25 μm. The surface of the interlevel dielectric layer had neither copper deposit nor discoloration due to the electroless plating but featured a very high degree of smoothness.

EXAMPLE 16

The insulating composition of Example 12 was screen printed on a 1-mm thick glass-epoxy resin laminated substrate having a copper metallization pattern formed on it. The screen was made of a polyester and had an opening size of 100 mesh/inch and the dielectric coating had a dry thickness of 20 μm. The applied coating was heat cured at 150° C. for 50 min to form an interlevel dielectric layer, which was thereafter roughened by means of a belt sander. To the thus treated interlevel dielectric layer, a light-sensitive dry film, ORDYL BF-603 (product of Tokyo Ohka Kogyo Co., Ltd.), was applied as a sandblast resistant coating by thermocompression bonding at 70° C. The applied film was then irradiated with ultraviolet rays (300 mJ/cm$^2$) from an ultrahigh-pressure mercury vapor lamp equipped exposing machine HTE 102S (product of Hitec Products, Inc.) through a mask pattern capable of reproducing 20 μm wide lines at spacings of 20 μm, and spray developed with an aqueous solution of 0.2% sodium carbonate at 30° C. for 40 sec at a spray pressure of 1.2 kg/cm$^2$.

Thereafter, the sandblast resistant coating was stripped by spraying an aqueous solution of 4 wt % sodium hydroxide at 50° C. for 1 min.

After stripping the sandblast resistant coating, the substrate was desmeared according to SHIPLEY THERCUPOSIT 200MLB PROCESS and then dipped in an electroless plating solution SHIPLEY CUPOSIT 250 (Shipley Company Inc.) for 1 h to form a conductive layer in a thickness of 5 μm. Neither nicking nor delamination occurred in the interlevel dielectric layer, and the channels experienced neither shorts nor conduction failure due to the breakage of metal interconnecting lines.

EXAMPLE 17–19

In Example 17, the formulation of Example 1 was used as a starting material for making an interlevel dielectric layer; in Examples 18 and 19, the formulations of Examples 2 and 3 were respectively used as starting materials. Each formulation was blended on a triple-roll mill to form an insulating composition. The composition was screen printed on a 1-mm thick glass-epoxy resin laminated substrate having a copper metallization pattern formed on it. The screen was made of a polyester and had an opening size of 100 mesh/inch and the dielectric coating had a dry thickness of 50 μm. In Examples 17 and 18, the applied dielectric coating was heat cured at 150° C. for 50 min; in Example 19, the applied dielectric coating was dried preliminarily at 80° C. for 50 min, subjected to full-frame exposure to UV light (500 mJ/cm$^2$) from an ultrahigh-pressure mercury vapor lamp equipped exposing machine, "HTE 102S" of Hitec Products, Inc., and finally heat cured at 150° C. for 50 min.

Subsequently, the surface of the interlevel dielectric layer was roughened by buffing to an average surface roughness (Ra) of 5 μm.

To each of the surface roughened interlevel dielectric layers, a light-sensitive dry film, ORDYL BF-603 (product of Tokyo Ohka Kogyo Co., Ltd.), was applied as a sandblast resistant coating by thermocompression bonding at 70° C. The applied film was then irradiated with ultraviolet rays (300 mJ/cm$^2$) from HTE 102S through a predetermined mask pattern and spray developed with an aqueous solution of 0.2% sodium carbonate at 30° C. for 40 sec at a spray pressure of 1.2 kg/cm$^2$.

Thereafter, the substrate was set up on a sandblasting machine SC-202 (product of Fuji Seisakusho K.K.) and the interlevel dielectric layer was sandblasted at a blast pressure of 2.5 kg/cm$^2$ for 6 min with silicon carbide particles (25 μm) used as a grinding medium. Subsequently, the sandblast resistant coating was stripped by spraying an aqueous solution of 3 wt % sodium hydroxide at 45° C. for 2 min.

After stripping the sandblast resistant coating, the substrate was washed with water and dipped in an aqueous solution of sodium hydroxide (10 g/L) for 5 min at a temperature of 50° C. before micro-etching was applied by dipping in an aqueous solution of the following formulation at 80° C. for 6 min.

(Micro-etching solution)

| | |
|---|---|
| Potassium permanganate | 50 g |
| Potassium hydroxide | 20 g |
| Water | 1,000 g |

Thereafter, each substrate was subjected to copper plating in a copper pyrophosphate bath (for its formulation, see below) under the conditions also set forth below.

(Plating bath)

| | |
|---|---|
| Copper pyrophosphate | 60–80 g/L |
| Potassium pyrophosphate | 250–400 g/L |
| Aqueous ammonia | 0.5–1 mL/L |
| Gloss agent | q.s. |

(Plating conditions)

| | |
|---|---|
| Temperature | 50–60° C. |
| Current density at cathode | 30–50 A/ft$^2$ |

The copper plating allowed a conductive layer to be formed in a thickness of 25 μm on the substrate surface. The plating time was 35 min.

The individual substrate samples were evaluated for the shape of via holes, the presence of undercuts, resistance to the heat of solder, insulation resistance and peeling strength by the methods and criteria already described above. The results are shown in Table 5.

TABLE 5

| | Example | | |
|---|---|---|---|
| | 17 | 18 | 19 |
| Shape of via holes | Inwardly tapered | Inwardly tapered | Inwardly tapered |
| Undercuts | No | No | No |
| Insulation resistance | >10$^{12}$ | >10$^{12}$ | >10$^{12}$ |
| Resistance to the beat of solder | Good | Good | Good |
| Peeling strength kg/cm | 2.0 | 1.9 | 1.8 |

EXAMPLE 20

Ten parts by weight of 2-mercaptobenzothiazole was added as a catalyst poison to the formulation of Example 17, which was then blended on a triple-roll mill, thereby forming an insulating composition. The composition was screen printed on a 1-mm thick glass-epoxy resin laminated substrate having a copper metallization pattern formed on it. The screen was made of a polyester and had an opening size of 100 mesh/inch and the dielectric coating had a dry thickness of 25 μm. The substrate was subsequently processed as in Example 17 to form via holes in selected areas of the interlevel dielectric layer, except that the sandblasting time was 3 min. The substrate was then given a preliminary treatment for micro-etching, micro-etched and subjected to direct electroplating as in Example 17, whereby the via holes were filled with a conductive layer in a thickness of 25 μm.

The surface of the interlevel dielectric layer had neither copper deposit nor discoloration due to the electroplating but featured a very high degree of smoothness. The plating time was 20 min.

EXAMPLE 21

The insulating composition of Example 17 was screen printed on a 1-mm thick glass-epoxy resin laminated substrate having a copper metallization pattern formed on it. The screen was made of a polyester and had an opening size of 100 mesh/inch and the dielectric coating had a dry thickness of 20 $\mu$m. The applied dielectric coating was heat cured at 150° C. for 50 min to form an interlevel dielectric layer. Thereafter, the substrate was set up on a sandblasting machine SC-202 (product of Fuji Seisakusho K.K.) and the interlevel dielectric layer was sandblasted at a blast pressure of 2.5 kg/cm$^2$ for 10 sec with silicon carbide particles (5 $\mu$m) used as a grinding medium. To the surface roughened interlevel dielectric layer, a light-sensitive dry film, ORDYL BF-603 (product of Tokyo Ohka Kogyo Co., Ltd.), was applied as a sandblast resistant coating by thermocompression bonding at 70° C. The applied film was then irradiated with ultraviolet rays (300 mJ/cm$^2$) from an ultrahigh-pressure mercury vapor lamp equipped exposing machine HTE 102S (product of Hitec Products, Inc.) through a mask pattern capable of reproducing 20 $\mu$m wide line at spacings of 20 $\mu$m, and spray developed with an aqueous solution of 0.2% sodium carbonate at 30° C. for 40 sec at a spray pressure of 1.2 kg/cm$^2$.

Thereafter, the substrate was set up on the same sandblasting machine and sandblasted with silicon carbide particles (5 $\mu$m) at a blast pressure of 2.5 kg/cm$^2$ for 2 min; subsequently, the sandblast resistant coating was stripped by spraying an aqueous solution of 3 wt % sodium hydroxide at 45° C. for 2 min.

The thus processed substrate was given a preliminary treatment for micro-etching, micro-etched and subjected to direct electroplating as in Example 17, whereby a conductive layer was formed in a thickness of 5 $\mu$m within the via holes. Neither nicking nor delamination occurred in the interlevel dielectric layer, and the channels experienced neither shorts nor conduction failure due to the breakage of metal interconnecting lines. The plating time was 7 min.

EXAMPLE 22–24 AND COMPARATIVE EXAMPLE 9–11

In Example 22, the formulation of Example 1 was used as a starting material for making an interlevel dielectric layer; in Examples 22 and 23 and in Comparative Examples 9–11, the formulations of Examples 2 and 3 and those of Comparative Examples 1–3 were respectively used as starting materials. Each formulation was blended on a triple-roll mill to form a heat or photocurable electrically insulating composition. The composition was screen printed on a 1-mm thick glass-epoxy resin laminated substrate having a copper metallization pattern formed on it. The screen was made of a polyester and had an opening size of 100 mesh/inch and the insulating coating had a dry thickness of 50 $\mu$m. In Examples 22 and 23, the applied insulating coating was slightly cured by heating at 90° C. for 40 min, and in Example 24, the insulation coating was also slightly cured by heating at 100° C. for 30 min.

To each of the slightly cured insulating layers, a light-sensitive dry film, ORDYL BF-603 T-3 (product of Tokyo Ohka Kogyo Co., Ltd.; film thickness=30 $\mu$m), was applied as a sandblast resistant coating by thermocompression bonding at 100° C. The applied film was then irradiated with ultraviolet rays (30 mJ/cm$^2$) from HTE 102S through a predetermined mask pattern and spray developed with an aqueous solution of 0.2% sodium carbonate at 30° C. for 40 sec at a spray pressure of 1.2 kg/cm$^2$.

Thereafter, the substrate was set up on a sandblasting machine SC-202 (product of Fuji Seisakusho K.K.) and the slightly cured insulation coating was sandblasted to form via holes at a blast pressure of 1.5 kg/cm$^2$ for 5 min with silicon carbide particles (25 $\mu$m) used as a grinding medium. Subsequently, the patterned sandblast resistant coating was stripped by spraying an aqueous solution of 3 wt % sodium hydroxide at 45° C. for 2 min. Neither nicking nor delamination occurred in the electrically insulating layer during the stripping step. The shape of the via holes was satisfactory.

After stripping the patterned sandblast resistant coating, the substrate was washed with water and, subsequently, the slightly cured insulating layer was heat cured at 150° C. for 50 min to form an interlevel dielectric layer. The substrate was again set up on the same sandblasting machine and the surface of the interlevel dielectric layer was roughened by sandblasting at a blast pressure of 2.5 kg/cm$^2$ for 1 min; the thus processed substrate was dipped in an aqueous solution of sodium hydroxide (10 g/L) for 5 min at a temperature of 50° C. before micro-etching was applied by dipping in an aqueous solution of the following formulation at 80° C. for 6 min.

(Micro-etching solution)

| | |
|---|---|
| Potassium permanganate | 50 g |
| Potassium hydroxide | 20 g |
| Water | 1,000 g |

Thereafter, the substrates of Examples 22 and 23 were subjected to electroless copper plating in a bath of the following formulation.

(Plating bath)

| | |
|---|---|
| Copper (supplied as copper sulfate) | 2.8 g/L |
| Formaldehyde | 3.5 g/L |
| Sodium hydroxide | 10–11 g/L |
| EDTA | q.s. |

The electroless copper plating allowed a conductive layer to be formed in a thickness of 25 $\mu$m over the substrate surface. The plating time was 15 h.

In Example 24, the substrate was dipped in an aqueous solution of palladium colloid particles (0.05 $\mu$m; concentration=2 g/L) for 10 min and then subjected to copper plating in a copper pyrophosphate bath (for its formulation, see below) under the conditions also set forth below.

(Plating bath)

| | |
|---|---|
| Copper pyrophosphate | 60–80 g/L |
| Potassium pyrophosphate | 250–400 g/L |
| Aqueous ammonia | 0.5–1 mL/L |
| Gloss agent | q.s. |

(Plating conditions)

| Temperature | 50–60° C. |
| --- | --- |
| Current density at cathode | 30–50 A/ft$^2$ |

The copper plating allowed a conductive layer to be formed in a thickness of 25 μm on the substrate surface. The plating time was 35 min.

In Comparative Examples 9–11, the insulating composition was screen printed on a 1-mm thick glass-epoxy resin laminated substrate to form a coating in a dry thickness of 50 μm. The applied coating was dried preliminarily at 60° C. for 90 min and irradiated with ultraviolet rays (500 mJ/cm$^2$) from an ultrahigh-pressure mercury vapor lamp equipped machine, HTE 102S (product of Hitec Products, Inc.), through a mask pattern. Subsequently, the insulation coating was spray developed with an aqueous solution of 1% sodium carbonate at 30° C. for 40 sec at a spray pressure of 1.2 kg/cm$^2$, thereafter irradiated with ultraviolet rays (5 J/cm$^2$) from the same exposing machine and finally heat cured at 150° C. for 50 min.

Thereafter, the samples of Comparative Examples 9 and 10 were subjected to electroless plating under the same conditions as used in Example 22, whereas the sample of Comparative Example 11 was subjected to direct electroplating under the same conditions as used in Example 24.

The individual substrates were evaluated for the shape of via holes, the presence of undercuts, resistance to the heat of solder, insulation resistance and peeling strength by the methods and criteria already described above. The results are shown in Table 6.

TABLE 6

|  | Example | | | Comparative Example | | |
| --- | --- | --- | --- | --- | --- | --- |
|  | 22 | 23 | 24 | 9 | 10 | 11 |
| Shape of via holes | Inwardly tapered | Inwardly tapered | Inwardly tapered | Trapezoidal | Trapezoidal | Trapezoidal |
| Undercuts | No | No | No | Yes | Yes | Yes |
| Insulation resistance | >10$^{12}$ | >10$^{12}$ | >10$^{12}$ | <10$^{11}$ | <10$^{11}$ | >10$^{12}$ |
| Resistance to the heat of solder | Good | Good | Good | Good | Poor | Poor |
| Peeling strength kg/cm | 1.2 | 1.0 | 1.0 | 0.4 | 0.4 | 0.4 |

EXAMPLE 25

An electrically insulating composition was prepared as in Example 24 and screen printed on a 1-mm thick glass-epoxy resin laminated substrate to form a film in a dry thickness of 50 μm. The applied film was dried preliminarily at 70° C. for 30 min, then heat cured at 150° C. for 30 min to form an interlevel dielectric layer. To this interlevel dielectric layer, a light-sensitive dry film, ORDYS BF-603 T-3 (product of Tokyo Ohka Kogyo co., Ltd.; film thickness=30 μm), was applied as a sandblast resistant coating by thermocompression bonding at 100° C. The applied film was then irradiated with ultraviolet rays (300 mJ/cm$^2$) from HTE 102S through a predetermined mask and spray developed with an aqueous solution of 0.2% sodium carbonate at 30° C. for 40 sec at a spray pressure of 1.2 kg/cm$^2$.

Thereafter, the substrate was set up on a sandblasting machine SC-202 (product of Fuji Seisakusho K.K.) and the interlevel dielectric layer was sandblasted at a blast pressure of 1.5 kg/cm$^2$ with silicon carbide particles (25 μm) used as a grinding medium. The sandblasting operation required 40 min for completion.

EXAMPLE 26

Ten parts by weight of 2-mercaptobenzothiazole was added as a catalyst poison to the formulation of Example 22, which was then blended on a triple-roll mill to form a heat or phtocurable electrically insulating composition. The composition was screen printed on a 1-mm thick glass-epoxy resin laminated substrate having a copper metallization pattern formed on it. The screen was made of a polyester and had an opening size of 100 mesh/inch and the insulating coating had a dry thickness of 25 μm. The substrate was subsequently processed as in Example 22 to form via holes in selected areas of the interlevel dielectric layer, except that the sandblasting time was 3 min. The substrate was then given a preliminary treatment for micro-etching, micro-etched and subjected to electroless plating as in Example 22, whereby the via holes were filled with a conductive layer in a thickness of 25 μm. The surface of the interlevel dielectric layer had neither copper deposit nor discoloration due to the electroless plating but featured a very high degree of smoothness. The plating time was 5 h.

EXAMPLE 27

A photo- or heat-curable electrically insulating composition was prepared as in Example 22 and screen printed on a 1-mm thick glass-epoxy resin laminated substrate having a copper metallization pattern formed on it. The screen was made of a polyester and had an opening size of 100 mesh/inch and the insulating coating had a dry thickness of 20 μm. The applied insulating coating was slightly cured by heating at 90° C. for 40 min and, thereafter, a light-sensitive dry film ORDYL BF-602 T-3 (product of Tokyo Ohka Kogyo Co., Ltd.; film thickness=20 μm) was applied as a sandblast resistant coating onto the slightly cured electrically insulating layer by thermocompression bonding at 70° C. Subsequently, the applied film was irradiated with ultraviolet rays (300 mJ/cm$^2$) from an ultrahigh-pressure mercury vapor lamp equipped exposing machine HTE 102S (product of Hitec Products, Inc.) through a mask pattern capable of reproducing 30 μm in diamter dots and spray developed with an aqueous solution of 0.2% sodium carbonate at 30° C. for 40 sec at a spray pressure of 1.2 kg/cm$^2$.

Thereafter, the substrate was set up on a sandblasting machine SC-202 (product of Fuji Seisakusho K.K.) and the slightly cured insulation layer was sandblasted at a blast pressure of 1.5 kg/cm$^2$ for 2 min with silicon carbide particles (5 μm) used as a grinding medium. Subsequently, the sandblast resistant coating was stripped by spraying an aqueous solution of 3 wt % sodium hydroxide at 45° C. for 2 min.

After stripping the sandblast resistant coating, the substrate was washed with water and, subsequently, the slightly cured insulating layer was heat cured at 150° C. for 50 min to form an interlevel dielectric layer. The substrate was then set up on the same sandblasting machine and the surface of the interlevel dielectric layer was roughened by sandblasting at a blast pressure of 2.5 kg/cm$^2$ for 10 sec; the thus processed substrate was given a preliminary treatment for micro-etching, micro-etched and subjected to direct electroplating as in Example 24, whereby a conductive layer was formed in a thickness of 5 μm within the via holes. Neither nicking nor delamination occurred in the interlevel dielectric layer, and the channels experienced neither shorts nor conduction failure due to the breakage of metal interconnecting line. The plating time was 7 min.

EXAMPLE 28

Ten parts by weight of 2-mercaptobenzothiazole was added as a catalyst poison to the formulation of Example 1, which was then blended on a triple-roll mill, thereby forming a heat or photocurable electrically insulating composition. The composition was screen printed on a 1-mm thick glass-epoxy resin laminated substrate using a polyester screen having an opening size of 100 mesh/inch. The substrate had been polished by buffing to an average surface roughness of 5 $\mu$m. The applied insulating coating had a dry thickness of 25 $\mu$m and was slightly cured by heating at 90° C. for 40 min.

Thereafter, a light-sensitive dry film ORDYL BF-603 T-3 (supra) was applied as a sandblast resistant coating onto the slightly cured electrically insulating layer by thermocompression bonding at 100° C. Subsequently, the applied film was irradiated with ultraviolet rays (300 mJ/cm$^2$) from HTE 102S through a mask pattern capable of reproducing 100 $\mu$m wide lines at spacings of 50 $\mu$m, and spray developed with an aqueous solution of 0.2% sodium carbonate at a spray pressure of 1.2 kg/cm$^2$ for 40 sec at 30° C.

Thereafter, the substrate was set up on a sandblasting machine SC-202 (Fuji Seisakusho K.K.) and the insulating layer was sandblasted at a blast pressure of 1.5 kg/cm$^2$ for 5 min with silicon carbide particles (25 $\mu$m) used as a grinding medium, whereby trenches were formed in the insulating layer. Subsequently, the patterned sandblast resistant coating was stripped by spraying an aqueous solution of 3 wt % sodium hydroxide at 45° C. for 2 min.

After stripping the patterned sandblast resistant coating, the substrate was washed with water and the slightly cured electrically insulating layer was heat cured at 150° C. for 50 min to form an interlevel dielectric layer. The thus processed substrate was dipped in an aqueous solution of sodium hydroxide (10 g/L) for 5 min at 50° C. before it was subjected to electroless plating in a bath of the following formulation.

(Plating bath)

| Copper (supplied as copper sulfate) | 2.8 g/L |
| --- | --- |
| Formaldehyde | 3.5 g/L |
| Sodium hydroxide | 10–11 g/L |
| EDTA | q.s. |

The electroless copper plating allowed a conductive layer to be formed in a thickness of 25 $\mu$m within the trenches. The surface of the interlevel dielectric layer was absent from copper deposit or discoloration due to the electroless plating and recurred a very high degree of smoothness.

The substrate was then set up on the same sandblasting machine SC-202 and the surface of the interlevel dielectric layer was roughened by sandblasting at a blast pressure of 2.5 kg/cm$^2$ for 1 min with silicon carbide particles (25 $\mu$m) used as a grinding medium. In a separate step, the formulation of Example 1 was blended on a triple-roll mill to prepare an insulating composition, which was screen printed on the interlevel dielectric layer having the conductive layer formed in the trenches. The screen was made of a polyester and had an opening size of 100 mesh/inch and the insulation coating had a dry thickness of 25 $\mu$m. The applied insulating coating was slightly cured by heating at 90° C. for 40 min.

To the slightly cured electrically insulating layer, a light-sensitive dry film ORDYL BF-603 T-3 (supra) was applied as a sandblast resistant coating by thermocompression bonding at 100° C. Then, in order to form via holes (50 $\mu$m $\phi$) for bridging two spaced conductive layers, the sandblast resistant coating was irradiated with ultraviolet rays (300 mJ/cm$^2$) from HTE 102S (supra) through a predetermined mask pattern and spray developed with an aqueous solution of 0.2% sodium carbonate at a spray pressure of 1.2 kg/cm$^2$ for 40 sec at 30° C.

Thereafter, the substrate was set up on the same sandblasting machine (SC-202) and the insulating layer was sandblasted at a blast pressure of 1.5 kg/cm$^2$ for 5 min with silicon carbide particles (25 $\mu$m) used as a grinding medium, until the conductive layer in the underlying interlevel dielectric layer became exposed. With via holes being thus formed, the patterned sandblast resistant coating was stripped by spraying an aqueous solution of 3 wt % sodium hydroxide at 45° C. for 2 min.

After stripping the patterned sandblast resistant coating, the substrate was washed with water and set up on the same sandblasting machine (SC-202); thereafter, the exposed surface of the second interlevel dielectric layer was roughened by sandblasting at a blast pressure of 2.5 kg/cm$^2$ for 1 min with silicon carbide particles (25 $\mu$m) used as a grinding medium.

The thus processed substrate was dipped in an aqueous solution of sodium hydroxide (10 g/L) at a temperature of 50° C. for 5 min before it was subjected to micro-etching by dipping in an aqueous solution of the following formulation at 80° C. for 6 min.

(Micro-etching solution)

| Potassium permanganate | 50 g |
| --- | --- |
| Potassium hydroxide | 20 g |
| Water | 1,000 g |

Thereafter, the substrate was subjected to copper plating in a copper pyrophosphate bath (for its formulation, see below) under the conditions also set for the below.

(Plating bath)

| Copper pyrophosphate | 60–80 g/L |
| --- | --- |
| Potassium pyrophosphate | 250–400 g/L |
| Aqueous ammonia | 0.5–1 mL/L |
| Gloss agent | q.s. |

(Plating conditions)

| Temperature | 50–60° C. |
| --- | --- |
| Current density at cathode | 30–50 A/ft$^2$ |

The copper plating allowed a conductive layer to be formed in a thickness of 15 $\mu$m within the via holes and over the second interlevel dielectric layer. The plating time was 21 min.

Subsequently, a dry film resist, ORDYL $\alpha$-400 (product of Tokyo Ohka Kogyo Co., Ltd.) was applied to the 15 $\mu$m thick conductive layer by thermocompression bonding at 100° C. Then, in order to bridge two spaced conductive layers in the first level, the resist layer was irradiated with ultraviolet rays (300 mJ/cm$^2$) from HTE 102S through a predetermined mask pattern capable of forming a pattern consisting of circles of 70 µm in diameter corresponding to the via holes and bridging lines of 50 µm in width and spray developed with an aqueous solution of 0.2% sodium carbonate at a spray pressure of 1.2 kg/cm² for 40 sec at 30° C.

Finally, the substrate was etched with an aqueous solution of cupric chloride (Cl concentration=80–100 g/L; specific gravity=1.2) at 80° C. for 10 min and thoroughly washed with water. The resulting bridging pattern had neither nicking nor delamination and exhibited good electrical connection to the first level of conductive layers.

What is claimed is:

1. A multilayer wiring board that has plurality of conductor patterns and an interlevel dielectric layer on at least one surface of a substrate, with via holes being provided at specified sites of said interlevel dielectric layer to establish an electrical interconnection between said conductor patterns, obtainable by a process wherein prior to provision of said via holes, a coating having resistance to sandblasting is formed in a pattern over the interlevel dielectric layer and then sandblasting is performed to remove the interlevel dielectric layer in selected areas to form the via holes, and thereafter, the coating having resistance to sandblasting is removed, followed by provision of a conductive layer to establish an electrical interconnection between said conductor patterns.

2. The multilayer wiring board according to claim 1, wherein the interlevel dielectric layer is formed by slightly curing a heat curable or photocurable electrically insulating layer, removing the slightly cured insulating layer in selected areas by sandblasting, and heat curing the remaining insulating layer.

3. The multilayer wiring board according to claim 1, wherein the process further includes roughening the surface of the interlevel dielectric layer.

4. The multilayer wiring board according to claim 3, wherein the coating having resistance to sandblasting is removed before the surface of the interlevel dielectric layer is roughened and then the conductive layer is provided.

5. The multilayer wiring board according to claim 3, wherein the surface of the interlevel dielectric layer is roughened before the coating having resistance to sandblasting is formed in a pattern over said layer.

6. The multilayer wiring board according to claim 3, wherein the surface of the interlevel dielectric layer is roughened to an average surface roughness (Ra) of 0.1–10 µm.

7. The multilayer wiring board according to claim 1, wherein the conductive layer is provided by electroless plating.

8. The multilayer wiring board according to claim 1, wherein the conductive layer is provided by direct electroplating.

9. The multilayer wiring board according to claim 1, wherein the coating having resistance to sandblasting is made of a light-sensitive resin.

10. The multilayer wiring board according to claim 9, wherein the coating having resistance to sandblasting is made of a light-sensitive resin containing a urethane(meth)acrylate oligomer, a water-soluble cellulosic resin, a photopolymerization initiator and a (meth)acrylate monomer.

11. The multilayer wiring board according to claim 1, wherein a sulfur-containing organic compound is incorporated in the interlevel dielectric layer.

12. The multilayer wiring board according to claim 1, wherein the interlevel dielectric layer is made of at least one member of the group consisting of an epoxy resin, a polyphenolic resin, a novolak resin, a polyamide resin and a polyimide resin.

13. The multilayered wiring board according to claim 1, wherein the heat curable or photocurable electrically insulating layer is slightly cured at a temperature of 70–110° C.

14. The multilayered wiring board according to claim 2, wherein the slightly cured electrically insulating layer is converted to the interlevel dielectric layer either by exposure to light or by heat curing at a temperature excessing 110° C. but not higher than 200° C.

15. A multilayer wiring board that has a plurality of conductor patterns and an interlevel dielectric layer on at least one surface of a substrate, with trench-like channels being provided at specified sites of said interlevel dielectric layer to establish an electrical interconnection between said conductor patterns, obtainable by a process wherein prior to provision of said trench-like channels, a coating having resistance to sandblasting is formed in a pattern over the interlevel dielectric layer and then sandblasting is performed to remove the interlevel dielectric layer in selected areas to form the trench-like channels in an inwardly tapered cross-sectional shape and, thereafter, the coating having resistance to sandblasting is removed, followed by provision of a conductive layer to establish an electrical interconnection between said conductor patterns.

16. The multilayer wiring board according to claim 15, wherein the interlevel dielectric layer is formed by slightly curing a heat curable or photocurable electrically insulating layer, removing the slightly cured insulating layer in selected areas by sandblasting, and heat curing the remaining insulating layer.

17. The multilayer wiring board according to claim 15, wherein the process further includes roughening the surface of the interlevel dielectric layer.

18. The multilayer wiring board according to claim 17, wherein the coating having resistance to sandblasting is removed before the surface of the interlevel dielectric layer is roughened and then the conductive layer is provided.

19. The multilayer wiring board according to claim 17, wherein the surface of the interlevel dielectric layer is roughened before the coating having resistance to sandblasting is formed in a pattern over said layer.

20. The multilayer wiring board according to claim 17, wherein the surface of the interlevel dielectric layer is roughened to an average surface roughness (Ra) of 0.1–10 µm.

21. The multilayer wiring board according to claim 15, wherein the conductive layer is provided by electroless plating.

22. The multilayer wiring board according to claim 15, wherein the conductive layer is provided by direct electroplating.

23. The multilayer wiring board according to claim 15, wherein the coating having resistance to sandblasting is made of a light-sensitive resin.

24. The multilayer wiring board according to claim 23, wherein the coating having resistance to sandblasting is made of a light-sensitive resin containing a urethane (meth)acrylate oligomer, a water-soluble cellulosic resin, a photopolymerization initiator and a (meth)acrylate monomer.

25. The multilayer wiring board according to claim 15, wherein a sulfur-containing organic compound is incorporated in the interlevel dielectric layer.

26. The multilayer wiring board according to claim 15, wherein the interlevel dielectric layer is made of at least one member of the group consisting of an epoxy resin, a polyphenolic resin, a novolak resin, a polyamide resin and a polyimide resin.

27. The multilayer wiring board according to claim 15, wherein the heat curable or photocurable electrically insulating layer is slightly cured at a temperature of 70–110° C.

28. The multilayer wiring board according to claim 17, wherein the slightly cured electrically insulating layer is converted to the interlevel dielectric layer either by exposure to light or by heat curing at a temperature excessing 110° C. but not higher than 200° C.

29. The multilayer wiring board according to claim 9, wherein the light sensitive resin is applied as a dry film.

30. The multilayer wiring board according to claim 10, wherein the light sensitive resin is applied as a dry film.

31. The multilayer wiring board according to claim 23, wherein the light sensitive resin is applied as a dry film.

32. The multilayer wiring board according to claim 24, wherein the light sensitive resin is applied as a dry film.

* * * * *

UNITED STATES PATENT AND TRADEMARK OFFICE
CERTIFICATE OF CORRECTION

PATENT NO. : 6,228,465 B1
DATED : May 8, 2001
INVENTOR(S) : Yoshikazu Takiguchi et al.

Page 1 of 1

It is certified that error appears in the above-identified patent and that said Letters Patent is hereby corrected as shown below:

Column 33, claim 28,
Line 1, change "claim 17" to -- claim 16 --.

Signed and Sealed this

Fifteenth Day of January, 2002

Attest:

Attesting Officer

JAMES E. ROGAN
Director of the United States Patent and Trademark Office